US012744007B2

(12) United States Patent
Feng et al.

(10) Patent No.: US 12,744,007 B2
(45) Date of Patent: Sep. 22, 2026

(54) DISPLAY PANEL AND DISPLAY APPARATUS

(71) Applicants: Hefei BOE Joint Technology Co., Ltd., Hefei (CN); BOE Technology Group Co., Ltd., Beijing (CN)

(72) Inventors: Xuehuan Feng, Beijing (CN); Yongqian Li, Beijing (CN)

(73) Assignees: Hefei Boe Joint Technology Co., ltd.; BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 19/096,755

(22) Filed: Apr. 1, 2025

(65) Prior Publication Data

US 2025/0232732 A1 Jul. 17, 2025

Related U.S. Application Data

(63) Continuation of application No. 18/279,069, filed as application No. PCT/CN2022/127475 on Oct. 25, 2022, now Pat. No. 12,315,459.

(51) Int. Cl.
*G09G 3/3266* (2016.01)
*G09G 3/3233* (2016.01)
*H10K 59/131* (2023.01)

(52) U.S. Cl.
CPC ......... *G09G 3/3266* (2013.01); *G09G 3/3233* (2013.01); *H10K 59/131* (2023.02); *G09G 2300/0408* (2013.01); *G09G 2300/0842* (2013.01); *G09G 2310/0286* (2013.01); *G09G 2330/021* (2013.01)

(58) Field of Classification Search
CPC ...... G09G 3/3266; G09G 3/3233; G09G 3/36; G09G 3/3677; G09G 3/20; G09G 2310/0286; G11C 19/28; H10K 59/131
See application file for complete search history.

(56) References Cited

U.S. PATENT DOCUMENTS 11,741,914 B1 * 8/2023 Li ........................ G09G 3/3674 345/87
11,881,188 B2 * 1/2024 Xu ........................ G09G 3/3677
12,218,147 B2 * 2/2025 Zhao .................... G09G 3/3677
2017/0200420 A1 * 7/2017 No ...................... G06F 13/1689
2019/0333433 A1 * 10/2019 Zhu .......................... G09G 3/20
(Continued)

FOREIGN PATENT DOCUMENTS

WO WO-2020082541 A1 * 4/2020 ........... G09G 3/3677

*Primary Examiner* — Sardis F Azongha

(57) ABSTRACT

Disclosed is a display panel including a base substrate (101), and a gate drive circuit (40), a plurality of clock signal lines, and a plurality of connecting lines (51) that are disposed on the base substrate (101). The plurality of clock signal lines are located on a side of the gate drive circuit (40) along a first direction (X) and are arranged in sequence. Each connecting line (51) is electrically connected with the gate drive circuit (40) and a clock signal line. At least one connecting line (51) includes a load adjusting portion (512) configured to compensate for a load difference between different clock signal lines. An orthographic projection of the load adjusting portion (512) of the at least one connecting line (51) on the base substrate (101) is at least partially overlapped with an orthographic projection of at least one clock signal line on the base substrate (101).

20 Claims, 12 Drawing Sheets

(56) References Cited

U.S. PATENT DOCUMENTS

2021/0295795 A1* 9/2021 Xiong .................. G09G 3/3677
2022/0122503 A1* 4/2022 Xiao .................... G09G 3/2003
2023/0178047 A1* 6/2023 Xiong .................. G09G 3/3674
345/87
2024/0012299 A1* 1/2024 Xiao ................. G02F 1/136222

* cited by examiner

DISPLAY PANEL AND DISPLAY APPARATUS

CROSS-REFERENCE TO RELATED APPLICATION(S)

The present application is a continuation of U.S. application Ser. No. 18/279,069 filed on Aug. 28, 2023, which is a U.S. National Phase Entry of International Application No. PCT/CN2022/127475 having an international filing date of Oct. 25, 2022. The entire contents of the above-identified applications are hereby incorporated by reference.

TECHNICAL FIELD

The present disclosure relates to, but is not limited to, the field of display technologies, in particular to a display panel and a display apparatus.

BACKGROUND

With constant development of a display technology, more and more types of display products have emerged, e.g., a Liquid Crystal Display (LCD), an Organic Light Emitting Diode (OLED) display, a Plasma Display Panel (PDP), and a Field Emission Display (FED).

SUMMARY

The following is a summary of subject matter described herein in detail. The summary is not intended to limit the protection scope of claims.

Embodiments of the present disclosure provide a display panel and a display apparatus.

In one aspect, an embodiment provides a display panel, including a base substrate, and a gate drive circuit, a plurality of clock signal lines, and a plurality of connecting lines that are disposed on the base substrate; wherein the plurality of clock signal lines are located on a side of the gate drive circuit along a first direction and are arranged in sequence; each connecting line is electrically connected with the gate drive circuit and a clock signal line. At least one of the plurality of connecting lines includes a load adjusting portion, wherein the load adjusting portion is configured to compensate for a load difference between different clock signal lines. An orthographic projection of the load adjusting portion of the at least one connecting line on the base substrate is at least partially overlapped with an orthographic projection of at least one clock signal line on the base substrate; or, each of the plurality of connecting lines includes a load adjusting portion, and load adjusting portions of the plurality of connecting lines are located on a side of the plurality of clock signal lines away from the gate drive circuit, or located on a side of the plurality of clock signal lines close to the gate drive circuit, or located within a spacing region between two adjacent clock signal lines.

In some exemplary implementation modes, the orthographic projection of the load adjusting portion of the at least one connecting line on the base substrate is at least partially overlapped with an orthographic projection of a clock signal line connected with the load adjusting portion on the base substrate.

In some exemplary implementation modes, orthographic projections of the load adjusting portions of the plurality of connecting lines on the base substrate are overlapped with an orthographic projection of a same clock signal line on the base substrate.

In some exemplary implementation modes, the at least one connecting line further includes a first connecting portion and a second connecting portion, the load adjusting portion is connected between the first connecting portion and the second connecting portion, the first connecting portion is electrically connected with a clock signal line, and the second connecting portion is electrically connected with the gate drive circuit. The plurality of clock signal lines extend along a second direction, the second direction intersects with the first direction; and the second connecting portion of the at least one connecting line extends along the first direction.

In some exemplary implementation modes, the load adjusting portion of the at least one connecting line includes a first sub-connecting portion, a second sub-connecting portion, and a third sub-connecting portion, the first sub-connecting portion and the third sub-connecting portion extend along the second direction, the second sub-connecting portion extends along the first direction, and two ends of the second sub-connecting portion are respectively connected with the first sub-connecting portion and the third sub-connecting portion.

In some exemplary implementation modes, the load adjusting portion of the at least one connecting line further includes a fourth sub-connecting portion extending along the first direction, two ends of the fourth sub-connecting portion are respectively connected with the first sub-connecting portion and the third sub-connecting portion; and lengths of the second sub-connecting portion and the fourth sub-connecting portion along the first direction are approximately the same.

In some exemplary implementation modes, lengths of first sub-connecting portions of the load adjusting portions of the plurality of connecting lines along the second direction are substantially the same, and lengths of third sub-connecting portions of the load adjusting portions of the plurality of connecting lines along the second direction are substantially the same.

In some exemplary implementation modes, a distance between a second sub-connecting portion and a fourth sub-connecting portion of a load adjusting portion of a connecting line electrically connected with a clock signal line close to the gate drive circuit along the second direction is smaller than a distance between a second sub-connecting portion and a fourth sub-connecting portion of a load adjusting portion of a connecting line electrically connected with a clock signal line away from the gate drive circuit along the second direction.

In some exemplary implementation modes, lengths of first connecting portions of the plurality of connecting lines along the second direction are substantially the same, and a length of a second connecting portion of a connecting line electrically connected with a clock signal line close to the gate drive circuit along the first direction is smaller than a length of a second connecting portion of a connecting line electrically connected with a clock signal line away from the gate drive circuit along the first direction.

In some exemplary implementation modes, a distance between a second sub-connecting portion and a fourth sub-connecting portion of a load adjusting portion of a connecting line electrically connected with a clock signal line close to the gate drive circuit along the second direction is greater than a distance between a second sub-connecting portion and a fourth sub-connecting portion of a load adjusting portion of a connecting line electrically connected with a clock signal line away from the gate drive circuit along the second direction.

In some exemplary implementation modes, lengths of second connecting portions of the plurality of connecting lines along the first direction are substantially the same, and a length of a first connecting portion of a connecting line electrically connected with a clock signal line close to the gate drive circuit along the first direction is greater than a length of a first connecting portion of a connecting line electrically connected with a clock signal line away from the gate drive circuit along the first direction.

In some exemplary implementation modes, an overlapping area of an orthographic projection of a load adjusting portion of a connecting line electrically connected with a clock signal line away from the gate drive circuit and an orthographic projection of the clock signal line, is greater than an overlapping area of an orthographic projection of a load adjusting portion of a connecting line electrically connected with a clock signal line close to the gate drive circuit and an orthographic projection of the clock signal line.

In some exemplary implementation modes, the gate drive circuit includes a plurality of cascaded gate drive sub-circuits; each gate drive sub-circuit at least includes a first output transistor; and the first output transistor is configured to provide a clock signal to a signal output terminal of the gate drive sub-circuit. A size of a first output transistor of a gate drive sub-circuit electrically connected with a clock signal line away from the gate drive circuit is greater than a size of a first output transistor of a gate drive sub-circuit electrically connected with a clock signal line close to the gate drive circuit.

In some exemplary implementation modes, a voltage amplitude of a clock signal transmitted by a clock signal line close to the gate drive circuit is smaller than a voltage amplitude of the clock signal transmitted by a clock signal line away from the gate drive circuit.

In some exemplary implementation modes, resistances of the plurality of connecting lines are substantially the same.

In another aspect, an embodiment provides a display apparatus, including the aforementioned display panel.

Other aspects may be understood upon reading and understanding drawings and detailed description.

BRIEF DESCRIPTION OF THE DRAWINGS

Accompanying drawings are used for providing further understanding of technical solutions of the present disclosure, constitute a part of the specification, and are used for explaining the technical solutions of the present disclosure together with the embodiments of the present disclosure, but do not constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1:
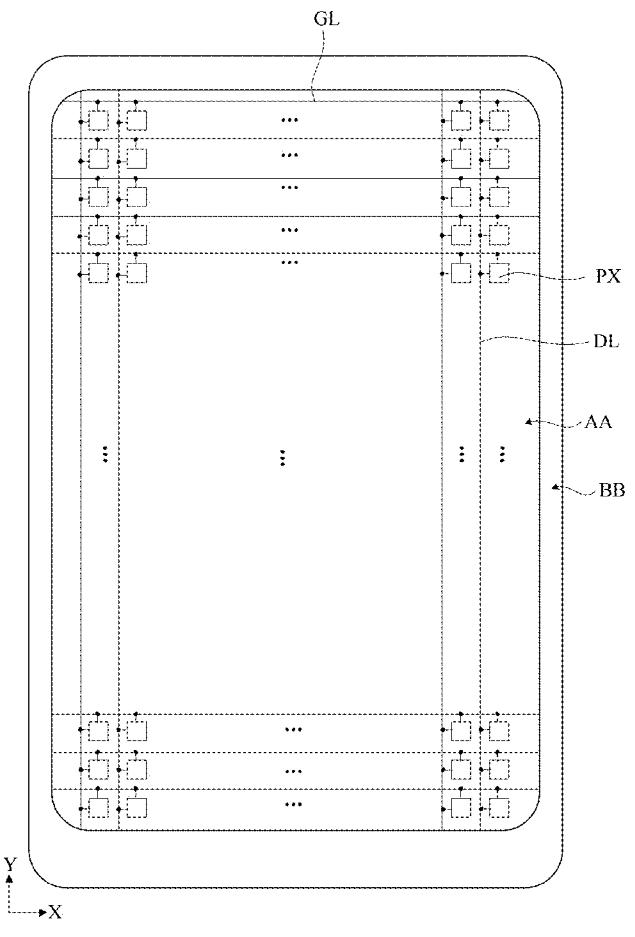
FIG. 1 is a schematic diagram of an outline of a display panel.

The embodiments of the present disclosure will be described below with reference to the drawings in detail. Implementation modes may be implemented in a plurality of different forms. Those of ordinary skills in the art may easily understand such a fact that modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one mode of the present disclosure is not necessarily limited to the size, and shapes and sizes of various components in the drawings do not reflect actual scales. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion between constituent elements, but not to set a limit in quantity. In the present disclosure, "plurality" may include two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to directions for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two elements. Those of ordinary skills in the art may understand meanings of the above-mentioned terms in the present disclosure according to situations.

In the specification, an "electrical connection" includes a case that constituent elements are connected together through an element with a certain electrical effect. The "element with the certain electrical effect" is not particularly limited as long as electrical signals between the connected constituent elements may be transmitted. Examples of the "element with the certain electrical effect" not only include electrodes and wirings, but also include switching elements such as transistors, resistors, inductors, capacitors, other elements with one or more functions, etc.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the present disclosure, the channel region refers to a region which the current flows mainly through.

In this specification, for distinguishing two electrodes, except the gate electrode, of the transistor, one of the electrodes is called a first electrode, and the other electrode is called a second electrode. The first electrode may be a source or a drain, and the second electrode may be a drain or a source. In addition, a gate of the transistor may be called a control electrode. In a case that transistors with opposite polarities are used, in a case that a direction of a current is changed during operation of a circuit, or the like, functions of the "source electrode" and the "drain electrode" are sometimes interchangeable. Therefore, the "source electrode" and the "drain electrode" are interchangeable in the specification.

In the specification, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 100°, and thus may include a state in which the angle is above 85° and below 95°.

A triangle, rectangle, trapezoid, pentagon, or hexagon, etc. in this specification is not strictly defined, and it may be an approximate triangle, rectangle, trapezoid, pentagon, or hexagon, etc. There may be some small deformation caused by tolerance, and there may be a chamfer, an arc edge, and deformation, etc.

In the specification, a "film" and a "layer" are interchangeable. For example, a "conductive layer" may be replaced with a "conductive film" sometimes. Similarly, an "insulation film" may be replaced with an "insulation layer" sometimes.

In this specification, "about" and "substantially" refer to that a boundary is not defined strictly and a case within a process and measurement error range is allowed. In this specification, "substantially the same" may be a case where numerical values differ by less than 10%.

FIG. 1 is a schematic diagram of an outline of a display panel, wherein the outline has a rectangular shape with rounded chamfers. In some examples, the display panel may be a closed polygon including linear sides, a circle or an ellipse including a curved side, a semi-circle or semi-ellipse including a linear side and a curved side, or the like. In some examples, at least some corners of the display panel may be curves when the display panel has linear sides. A part at an intersection of adjacent linear sides may be replaced with a curve with a predetermined curvature when the display panel has a rectangular shape. Among them, the curvature may be set according to different positions of a curve. For example, the curvature may be changed according to a position where the curve starts, a length of the curve, etc.

In some examples, as shown in FIG. 1, the display panel may include a display region AA and a peripheral region BB surrounding the display region AA. In some examples, the display region AA may include a first edge (lower edge) and a second edge (upper edge) oppositely disposed in a second direction Y, and a third edge (left edge) and a fourth edge (right edge) oppositely disposed in a first direction X. Adjacent edges may be connected through an arc chamfer to form a quadrilateral shape with rounded chamfers. In some examples, the peripheral region BB may include a first frame (lower frame) and a second frame (upper frame) oppositely disposed in the second direction Y, and a third frame (left frame) and a fourth frame (right frame) oppositely disposed in the first direction X. The first frame is in communication with the third frame and the fourth frame respectively, and the second frame is in communication with the third frame and the fourth frame respectively.

In some examples, as shown in FIG. 1 the display region AA may at least include a plurality of sub-pixels PX, a plurality of scan lines GL, and a plurality of data lines DL. The plurality of scan lines GL may extend along the first direction X and the plurality of data lines DL may extend along the second direction Y. Orthographic projections of the plurality of scan lines GL and the plurality of data lines DL on a base substrate may cross to form a plurality of sub-pixel regions, and a sub-pixel PX may be disposed within each sub-pixel region. The plurality of data lines DL are electrically connected with the plurality of sub-pixels PX and the plurality of data lines DL may be configured to provide data signals to the plurality of sub-pixels PX. The plurality of scan lines GL are electrically connected with the plurality of sub-pixels PX, and the plurality of scan lines GL may be configured to provide scan signals to the plurality of sub-pixels PX.

In some examples, as shown in FIG. 1, the first direction X may be an extension direction (row direction) of the scan lines GL in the display region AA, and the second direction Y may be an extension direction (column direction) of the data lines DL in the display region AA. The first direction X and the second direction Y may be perpendicular to each other.

In some examples, one pixel unit of the display region AA may include three sub-pixels, wherein the three sub-pixels are respectively a red sub-pixel, a green sub-pixel, and a blue sub-pixel. However, this embodiment is not limited thereto. In some examples, one pixel unit may include four sub-pixels, and the four sub-pixels are a red sub-pixel, a green sub-pixel, a blue sub-pixel, and a white sub-pixel respectively.

In some examples, a shape of the sub-pixel may be a rectangle, a rhombus, a pentagon, or a hexagon. When one pixel unit includes three sub-pixels, the three sub-pixels may be arranged side by side horizontally, side by side vertically, or in a shape of a Chinese character "品". When one pixel unit includes four sub-pixels, the four sub-pixels may be arranged side by side horizontally, side by side vertically, or in a shape of a square. However, this embodiment is not limited thereto.

In some examples, one sub-pixel may include a pixel circuit and a light emitting element electrically connected with the pixel circuit. The pixel circuit may include a plurality of transistors and at least one capacitor. For example, the pixel circuit may be a 3T1C structure, a 7T1C structure, a 5T1C structure, an 8T1C structure, or an 8T2C structure, etc., wherein T in the above circuit structures refers to a thin film transistor, C refers to a capacitor, a number before T represents a quantity of thin film transistors in the circuit, and a number before C represents a quantity of capacitors in the circuit.

In some examples, the light emitting element may be any of a Light Emitting Diode (LED), an Organic Light Emitting Diode (OLED), a Quantum dot Light Emitting Diode (QLED), a micro LED (including: mini-LED or micro-LED), and the like. For example, the light emitting element may be an OLED, and the light emitting element may emit red light, green light, blue light, or white light, etc. under drive of its corresponding pixel circuit. A color of light emitted from the light emitting element may be determined as required. In some examples, the light emitting element may include an anode, a cathode, and an organic emitting layer located between the anode and the cathode. The anode of the light emitting element may be electrically connected with the corresponding pixel circuit. However, this embodiment is not limited thereto.

In some examples, the display panel may further include a gate drive circuit and a data drive circuit. For example, the gate drive circuit may be disposed at the third frame and the fourth frame of the display panel. The gate drive circuit may be formed together with sub-pixels in a process of forming the sub-pixels. The data drive circuit may be disposed on an independent chip or printed circuit board to be connected to the sub-pixels through a signal access pin on the display panel. For example, the data drive circuit may be formed and disposed at the first frame of the display panel using a chip on glass, a chip on plastics, a chip on film, etc., to be connected to the signal access pin. However, this embodiment is not limited thereto. In some examples, the data drive circuit may be directly disposed on the display panel.

In some examples, the gate drive circuit may generate scan signals to be provided to the scan lines GL through a clock signal, a start signal, or the like received from a timing controller. For example, the gate drive circuit may sequentially provide a scan signal with an on-level pulse to gate lines. In some examples, the gate drive circuit may include a shift register and may generate a scan signal in a manner of sequentially transmitting a start signal provided in a form of an on-level pulse to a next-stage circuit under control of a clock signal.

Figure 2:
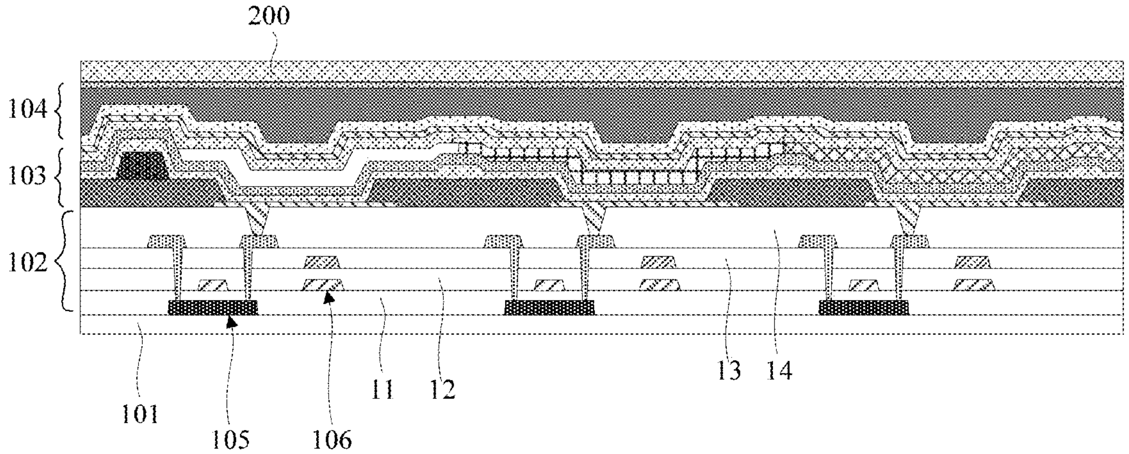
FIG. 2 is a schematic diagram of a partial sectional structure of a display region of a display panel.

FIG. 2 is a schematic diagram of a partial sectional structure of a display region of a display panel. FIG. 2 illustrates a structure of three sub-pixels in the display region 100. In some examples, as shown in FIG. 2, in a direction perpendicular to the display panel, the display panel may include a base substrate 101, and a circuit structure layer 102, a light emitting structure layer 103, an encapsulation structure layer 104, and an encapsulation cover plate 200 which are sequentially disposed on the base substrate 101. In some possible implementation modes, the display panel may include other film layers, such as a post spacer, which is not limited here in the present disclosure.

In some examples, as shown in FIG. 2, the base substrate 101 may be a rigid base substrate or a flexible base substrate. For example, the rigid base substrate may be made of a material such as glass or quartz. The flexible base substrate may be made of Polyimide (PI) or another material, and the flexible base substrate may be of a single-layer structure or a laminated structure composed of an inorganic material layer and a flexible material layer. However, this embodiment is not limited thereto.

In some examples, as shown in FIG. 2, the circuit structure layer 102 of each sub-pixel may include a plurality of transistors and a storage capacitor which form a pixel circuit. Illustration is made in FIG. 2 by taking a case that a pixel circuit of each sub-pixel includes one transistor and one storage capacitor as an example. In some possible implementation modes, the circuit structure layer 102 of each sub-pixel may include an active layer, a first insulation layer 11, a first gate metal layer (e.g., including a gate electrode of the transistor and a first electrode plate of the storage capacitor), a second insulation layer 12, a second gate metal layer (e.g., including a second electrode plate of the storage capacitor), a third insulation layer 13, a first source-drain metal layer (e.g., including a source electrode and a drain electrode of the transistor), and a fourth insulation layer 14 that are sequentially disposed on the base substrate 101. The third insulation layer 13 is provided with a via exposing a surface of the active layer, and the source electrode and the drain electrode of the transistor may be connected with the active layer through a via, respectively. The fourth insulation layer 14 may be provided with a via exposing the drain electrode of the transistor. The active layer, the gate electrode, the source electrode, and the drain electrode may form a transistor 105, and the first electrode plate and the second electrode plate may form a storage capacitor 106.

In some examples, as shown in FIG. 2, the light emitting structure layer 103 may include an anode layer, a pixel definition layer, an organic emitting layer, and a cathode. The anode layer may include an anode of a light emitting element, the anode may be disposed on the fourth insulation layer 14 and connected with the drain electrode of the transistor of the pixel circuit through the via provided on the fourth insulation layer 14. The pixel definition layer may be disposed on the anode layer and the fourth insulation layer 14, and is provided with a pixel opening, and the pixel opening may expose a portion of a surface of the anode. The organic emitting layer is at least partially disposed within the pixel opening, and is connected with the anode. The cathode is disposed on the organic emitting layer, and is connected with the organic emitting layer. The organic emitting layer emits light of a corresponding color under drive of the anode and the cathode.

In some examples, as shown in FIG. 2, the encapsulation structure layer 104 may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is disposed between the first encapsulation layer and the third encapsulation layer, which may ensure that external water vapor cannot enter the light emitting structure layer 103.

In some examples, the organic emitting layer may at least include a hole injection layer, a hole transport layer, an emitting layer, and a hole block layer which are stacked on the anode. In some examples, hole injection layers of all sub-pixels may be a common layer connected together; hole transport layers of all sub-pixels may be a common layer connected together; emitting layers of adjacent sub-pixels may be slightly overlapped or may be isolated; and hole block layers may be a common layer connected together. However, this embodiment is not limited thereto.

Figure 3:
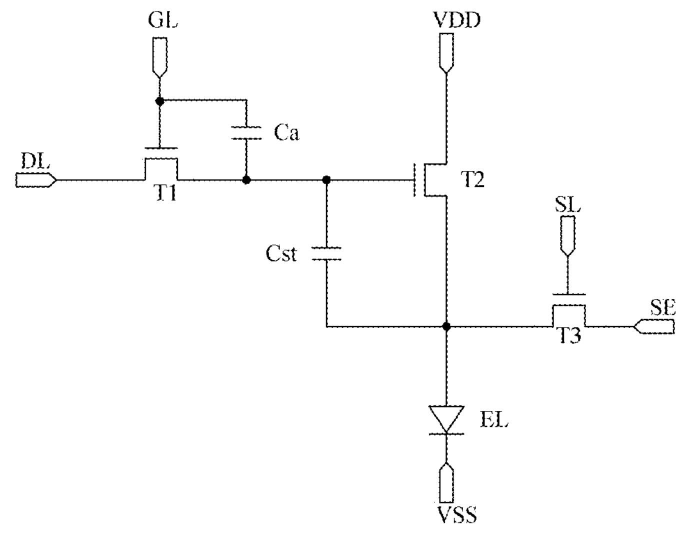
FIG. 3 is an equivalent circuit diagram of a pixel circuit.

FIG. 3 is an equivalent circuit diagram of a pixel circuit. In some examples, as shown in FIG. 3, the pixel circuit of this example has a 3T1C structure and may include three transistors (i.e., a first transistor T1, a second transistor T2, and a third transistor T3) and one storage capacitor Cst. The first transistor T1 may also be referred to as a switching transistor, the second transistor T2 may also be referred to as a drive transistor, and the third transistor T3 may also be referred to as a compensation transistor. The pixel circuit may be electrically connected with a data line DL, a scan line GL, a sensing control line SL, a sensing compensation line SE, a first power supply line VDD, and a second power supply line VSS. A parasitic capacitance Ca may be formed between a gate electrode of the first transistor T1 and a gate electrode of the second transistor T2.

In some examples, as shown in FIG. 3, the gate electrode of the first transistor T1 is electrically connected with the scan line GL, a first electrode of the first transistor T1 is connected with the data line DL, and a second electrode of the first transistor T1 is electrically connected with the gate electrode of the second transistor T2. A first electrode of the second transistor T2 is electrically connected with the first power supply line PL1, and a second electrode of the second transistor T2 is electrically connected with a first electrode of a light emitting element EL. A gate electrode of the third transistor T3 is electrically connected with the sensing control line SL, a first electrode of the third transistor T3 is electrically connected with the sensing compensation line SE, and a second electrode of the third transistor T3 is electrically connected with the second electrode of the second transistor T2. A first electrode plate of the storage capacitor Cst is electrically connected with the gate electrode of the second transistor T2, and a second electrode plate of the storage capacitor Cst is electrically connected with the second electrode of the second transistor T2. A second electrode of the light emitting element EL is electrically connected with the second power supply line VSS. In some examples, the light emitting element EL may be an OLED, including a first electrode (anode), an organic emitting layer, and a second electrode (cathode) that are stacked.

In some examples, as shown in FIG. 3, the first transistor T1 may be configured to receive a data voltage transmitted by the data line DL under control of the scan line GL, so that the gate electrode of the second transistor T2 receives the data voltage. The second transistor T2 may be configured to generate a corresponding current at the second electrode under control of the data voltage received by the gate electrode thereof. The third transistor T3 is configured to extract a threshold voltage Vth and a migration rate of the second transistor T2 under control of the sensing control line SL to compensate for the threshold voltage Vth. The storage capacitor Cst may be configured to store a potential of the gate electrode of the second transistor T2. The light emitting element EL is configured to emit light with corresponding brightness in response to a current of the second electrode of the second transistor T2.

In some examples, the first power supply line VDD may provide a high-level signal continuously, and the second power supply line VSS may provide a low-level signal continuously. For example, the first power supply line VDD provides a first power supply voltage Vdd and the second power supply line VSS provides a second power supply voltage Vss.

In some examples, the first transistor T1, the second transistor T2, and the third transistor T3 may be P-type transistors or may be N-type transistors. Use of a same type of transistors in a pixel circuit may simplify a process flow, reduce process difficulties of a display panel, and improve a yield of products.

In some examples, low temperature polysilicon thin film transistors, or oxide thin film transistors, or a low temperature polysilicon thin film transistor and an oxide thin film transistor, may be adopted for a plurality of transistors in a pixel circuit. An active layer of the low temperature polysilicon thin film transistor is made of Low Temperature PolySilicon (LTPS), and an active layer of the oxide thin film transistor is made of an oxide semiconductor (Oxide). The low temperature polysilicon thin film transistor has advantages such as a high migration rate and fast charging, and the oxide thin film transistor has advantages such as a low leakage current. The low temperature polysilicon thin film transistor and the oxide thin film transistor are integrated on one display panel, that is, an LTPS+Oxide (LTPO for short) display panel, so that advantages of both the low temperature polysilicon thin film transistor and the oxide thin film transistor may be utilized, low-frequency drive may be achieved, power consumption may be reduced, and display quality may be improved.

In some examples, illustration is made by taking a case that transistors of the pixel circuit shown in FIG. 3 are all N-type transistors as an example. A working process of the pixel circuit shown in FIG. 3 may include following stages.

In a data writing stage, a high-level signal is input to the scan line GL, a high-level signal is input to the sensing control line SL, the first transistor T1 is turned on, and the third transistor T3 is turned on. The data voltage Vdata provided by the data line DL is transferred to the gate electrode of the second transistor T2. That is, a voltage of the gate electrode of the second transistor T2 is Vg=Vdata, and a voltage of the second electrode of the second transistor T2 is Vs=Vsen+ΔV, wherein Vsen is a compensation voltage provided by the sensing compensation line SE; and ΔV is a voltage variation amount of the second electrode of the second transistor T2 generated due to turn-on of the second transistor T2 in the data writing stage.

In a light emitting stage, a low-level signal is input to the scan line GL and a low-level signal is input to the sensing control line SL. The first transistor T1 is turned off and the third transistor T3 is turned off. Under control of the data voltage Vdata, the second transistor T2 may transfer the first power supply voltage Vdd provided by the first power supply line VDD to the second electrode of the second transistor T2, to drive the light emitting element EL to emit light.

In a process from data writing to light emitting, when the gate electrode of the first transistor T1 is turned on, a process that the second electrode of the first transistor T1 changes from a third power supply voltage Vgh to a fourth power supply voltage Vgl and a coupling process between a parasitic capacitance Ca and a storage capacitance Cst enables a potential of the gate electrode of the second transistor T2 to have a change amount ΔVp. ΔVp=ΔV1×CST/(CST+CA), wherein CST represents a capacitance value of the storage capacitance Cst, CA represents a capacitance value of the parasitic capacitance Ca, ΔV1=Vgh−Vgl. That is, when the gate electrode of the first transistor T1 is turned on, for a process that the second electrode of the first transistor T1 changes from the third power supply voltage Vgh to the fourth power supply voltage Vgl, this voltage change will have a voltage coupling effect on the gate electrode of the second transistor T2, that is, ΔVp. In addition, ΔVp is also affected by a falling edge of the scan signal provided by the scan line GL, and the larger the falling edge of the scan signal is, the smaller the ΔVp is.

In some examples, the gate drive circuit may include a plurality of cascaded gate drive sub-circuits. For example, each gate drive sub-circuit may serve as a shift register to sequentially transmit a scan signal to a next gate drive sub-circuit, turn on a first transistor of a pixel circuit row by row, and complete data signal writing.

Figure 4:
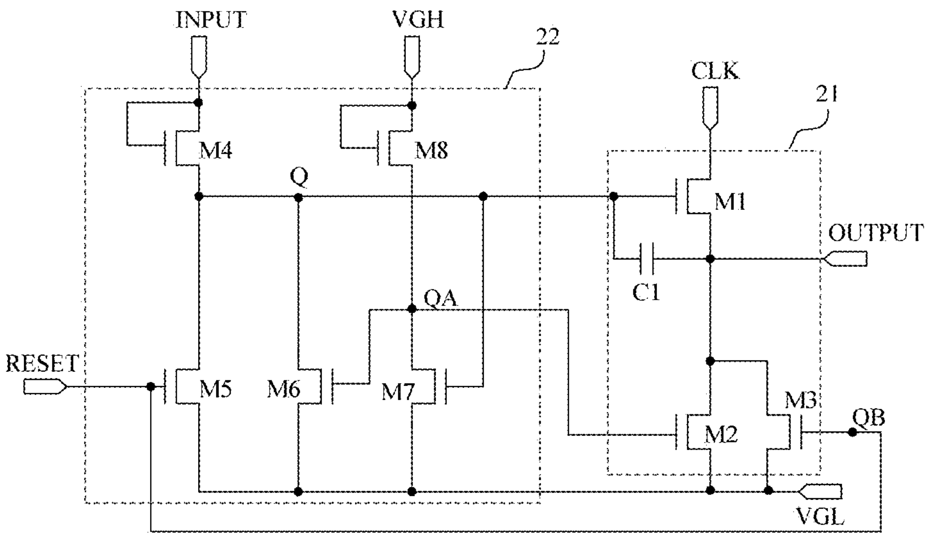
FIG. 4 is an equivalent circuit diagram of a gate drive sub-circuit.

FIG. 4 is an equivalent circuit diagram of a gate drive sub-circuit. The gate drive sub-circuit of this example is only schematic. In some examples, as shown in FIG. 4, the gate drive sub-circuit may include a shift unit 22 and an output unit 21. The output unit 21 is electrically connected with a clock signal terminal CLK, a fourth power supply line VGL, a signal output terminal OUTPUT, a first control node Q, a second control node QA, and a third control node QB, and is configured to provide a signal of the clock signal terminal CLK to the signal output terminal OUTPUT under control of the first control node Q, and to provide a signal of the fourth power supply line VGL to the signal output terminal OUTPUT under control of the second control node QA and the third control node QB. The shift unit 22 is electrically connected with a signal input terminal INPUT, a reset signal terminal RESET, a third power supply line VGH, a first control node Q, a second control node QA, and a third control node QB, and is configured to control potentials of the first control node Q, the second control node QA, and the third control node QB under control of the signal input terminal INPUT and the reset signal terminal RESET. Among them, the third power supply line VGH continuously provides a third power supply voltage Vgh with a high potential, and the fourth power supply line VGL continuously provides a third power supply voltage Vgl with a low potential.

In some examples, as shown in FIG. 4, the output unit 21 may include a first output transistor M1, a second output transistor M2, a third output transistor M3, and a first capacitor C1. A gate electrode of the first output transistor M1 is electrically connected with the first control node Q, a first electrode is electrically connected with the clock signal terminal CLK, and a second electrode is electrically connected with the signal output terminal OUTPUT. A gate electrode of the second output transistor M2 is electrically connected with the second control node QA, a first electrode is electrically connected with the fourth power supply line VGL, and a second electrode is electrically connected with the signal output terminal OUTPUT. A gate electrode of the third output transistor M3 is electrically connected with the third control node QB, a first electrode is electrically connected with the fourth power supply line VGL, and a second electrode is electrically connected with the signal output terminal OUTPUT. A first electrode plate of the first capacitor C1 is electrically connected with the first control node Q, and a second electrode plate is electrically connected with the signal output terminal OUTPUT.

In some examples, as shown in FIG. 4, the shift unit 22 may include a first shift transistor M4, a second shift transistor M5, a third shift transistor M6, a fourth shift transistor M7, and a fifth shift transistor M8. A gate electrode and a first electrode of the first shift transistor M4 are electrically connected with the signal input terminal INPUT, and a second electrode is electrically connected with the first control node Q. A gate electrode of the second shift transistor M5 is electrically connected with the third control node QB, a first electrode is electrically connected with the fourth power supply line VGL, and a second electrode is electrically connected with the first control node Q. The third control node QB is electrically connected with the reset signal terminal RESET. A gate electrode of the third shift transistor M6 is electrically connected with the second control node QA, a first electrode is electrically connected with the fourth power supply line VGL, and a second electrode is electrically connected with the first control node Q. A gate electrode of the fourth shift transistor M7 is electrically connected with the first control node Q, a first electrode is electrically connected with the fourth power supply line VGL, and a second electrode is electrically connected with the second control node QA. A gate electrode and a first electrode of the fifth shift transistor M8 are electrically connected with the third power supply line VGH, and a second electrode is electrically connected with the second control node QA.

Figure 5:
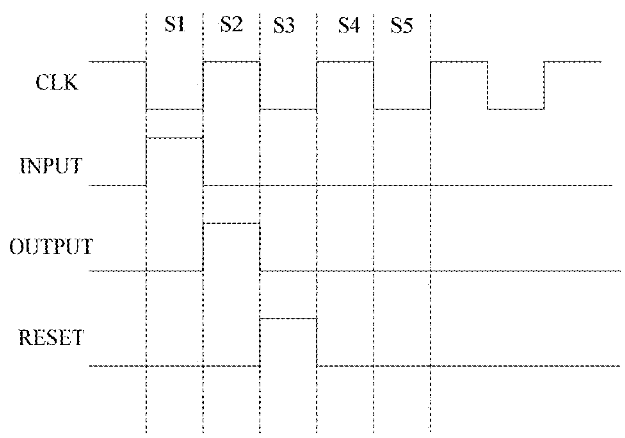
FIG. 5 is a working timing diagram of the gate drive sub-circuit shown in FIG. 4.

In the following, a case that transistors in the gate drive sub-circuit shown in FIG. 4 are all N-type transistors is taken as an example. FIG. 5 is a working timing diagram of the gate drive sub-circuit shown in FIG. 4. As shown in FIGS. 4 and 5, a working process of the gate drive sub-circuit includes following stages.

In a first stage S1, that is, an input stage, a signal of the signal input terminal INPUT is at a high level, input signals of the reset signal terminal RESET and the clock signal terminal CLK are all at a low level, and an output signal of the signal output terminal OUTPUT is a low-level signal. The signal of the signal input terminal INPUT is at the high level, the first shift transistor M4 is turned on, a potential of the first control node Q is pulled high, and the first capacitor C1 is charged. Although the third power supply line VGH continuously provides the third power supply voltage Vgh at a high level and the fifth shift transistor M8 is turned on, since the potential of the first control node Q is at a high level, the fourth shift transistor M7 is turned on and a potential of the second control node QA is pulled down, and the third shift transistor M6 is not turned on and the potential of the first control node Q is not pulled down.

In a second stage S2, that is, an output stage, an input signal of the clock signal terminal CLK is at a high level, and input signals of the signal input terminal INPUT and the reset signal terminal RESET are at a low level. A signal of the signal input terminal INPUT is at a low level, the first shift transistor M4 is turned off, and the signal of the clock signal terminal CLK is turned to be at a high level. Because of a bootstrap effect of the first capacitor C1, the potential of the first control node Q is continuously pulled high, the high level of the first control node Q enables the first output transistor M1 to be turned on, and the signal output terminal OUTPUT outputs the high-level signal of the clock signal terminal CLK. In addition, rising of the potential of the first control node Q improves a turn-on capability of the first output transistor M1 and ensures charging of pixels.

In this stage, since the potential of the first control node Q is still at a high level, the fourth shift transistor M7 is still turned on and the potential of the second control node QA is pulled down, while the third shift transistor M6 and the second output transistor M2 are not turned on and potentials of the first control node Q and the signal output terminal OUTPUT are not pulled down.

In a third stage S3, that is, a reset stage, an input signal of the reset signal terminal RESET is at a high level, input signals of the signal input terminal INPUT and the clock signal terminal CLK are at a low level, and an output signal of the signal output terminal OUTPUT is at a low level. Among them, the input signal of the reset signal terminal RESET is at the high level, the second shift transistor M5 and the third output transistor M3 are turned on, the potential of the first control node Q is pulled down to be at a low level provided by the fourth power supply line VGL, the third output transistor M3 is turned on, and a potential of the signal output terminal OUTPUT is pulled down to be at the low level of the fourth power supply line VGL. Since the potential of the first control node Q is at a low level, the fourth shift transistor M7 is turned off, a potential of the second control node QA is at a high level, the third shift transistor M6 is turned on, and the potential of the first control node Q is continuously pulled down to reduce noise. The second output transistor M2 is turned on, and the potential of the signal output terminal OUTPUT is continuously pulled down to be at the low level of the fourth power supply line VGL to reduce noise.

In a fourth stage S4, an input signal of the clock signal terminal CLK is at a high level, since the potential of the first control node Q is at a low level, the first output transistor M1 is turned off, an output signal of the signal output terminal OUTPUT is at a low level, meanwhile, the fourth shift transistor M7 is turned off, the potential of the second control node QA is at a high level, the third shift transistor M6 is turned on, the potential of the first control node Q is continuously pulled down to reduce noise, the second output transistor M2 is turned on, and the potential of the signal output terminal OUTPUT is continuously pulled down to reduce noise.

In a fifth stage S5, an input signal of the clock signal terminal CLK is at a low level. Since the potential of the first control node Q is at a low level, the first output transistor M1 is turned off, and an output signal of the signal output terminal OUTPUT is at a low level, meanwhile, the fourth shift transistor M7 is turned off, the potential of the second control node QA is at a high level, and the third shift transistor M6 is turned on, and the potential of the first control node Q is continuously pulled down to reduce noise. The second output transistor M2 is turned on, and the potential of the signal output terminal OUTPUT is continuously pulled down to reduce noise.

After the third stage S3, the gate drive sub-circuit of this stage continues the fourth stage S4 and the fifth stage S5 until the signal input terminal INPUT receives a high-level signal again.

In this example, a signal of the signal input terminal INPUT is a pulse signal, which is at a high level only in the first stage S1; an output signal of the signal output terminal OUTPUT is a pulse signal, which is at a high level only in the second stage S2; and a signal of the reset signal terminal RESET is a pulse signal, which is at a high level only in the third stage S3.

Figure 6:
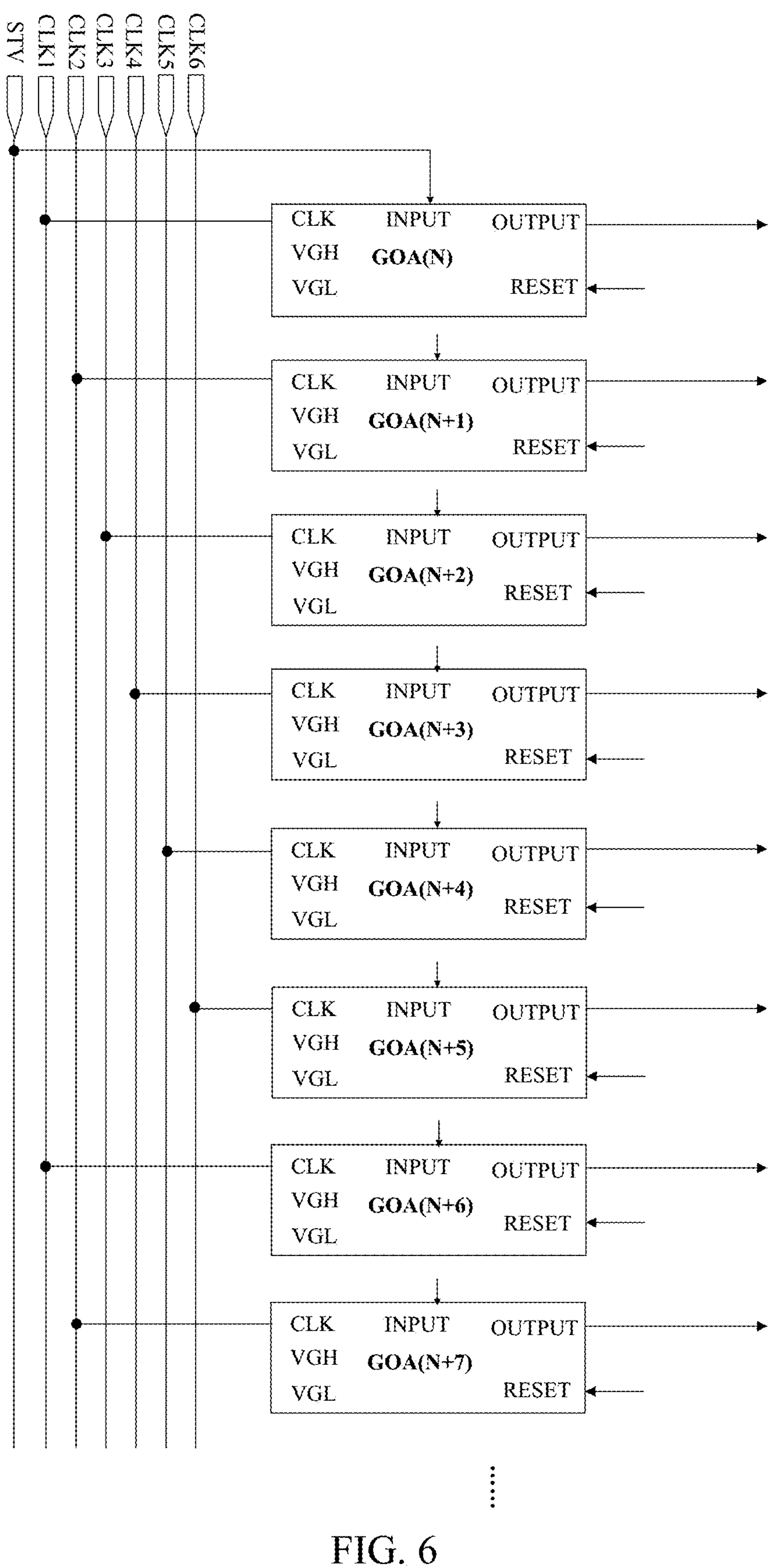
FIG. 6 is a schematic diagram of a gate drive circuit.

FIG. 6 is a schematic diagram of a gate drive circuit. In some examples, as shown in FIG. 6, the gate drive circuit may include a plurality of gate drive sub-circuits. The gate drive circuit may be electrically connected with a plurality of clock signal lines (including, for example, a first clock signal line CLK1 to a sixth clock signal line CLK6). However, this embodiment is not limited thereto. In other examples, the gate drive circuit may be electrically connected with four clock signal lines or eight clock signal lines.

In some examples, as shown in FIG. 6, a clock signal terminal of an Nth-level gate drive sub-circuit GOA(N) may be electrically connected with the first clock signal line CLK1, a clock signal terminal of an (N+1)th-level gate drive sub-circuit GOA(N+1) may be electrically connected with the second clock signal line CLK2, a clock signal terminal of an (N+2)th-level gate drive sub-circuit GOA(N+2) may be electrically connected with the third clock signal line CLK3, a clock signal terminal of an (N+3)th-level gate drive sub-circuit GOA(N+3) may be electrically connected with the fourth clock signal line CLK4, a clock signal terminal of an (N+4)th-level gate drive sub-circuit GOA(N+4) may be electrically connected with the fifth clock signal line CLK5, a clock signal terminal of an (N+5)th-level gate drive sub-circuit GOA(N+5) may be electrically connected with the sixth clock signal line CLK6, a clock signal terminal of an (N+6)th-level gate drive sub-circuit GOA(N+6) may be electrically connected with the first clock signal line CLK1, and a clock signal terminal of an (N+7)th-level gate drive sub-circuit GOA(N+7) may be electrically connected with the second clock signal line CLK2. In this example, six gate drive sub-circuits may be taken as a group to be electrically connected with six clock signal lines (i.e., the first clock signal line CLK1 to the sixth clock signal line CLK6), respectively. Every six gate drive sub-circuits may be used as a cycle, and so on. Among them, N is a positive integer.

In some examples, an output signal of a signal output terminal OUTPUT of each level of gate drive sub-circuit may be disposed as a scan signal to be provided to a pixel circuit of a row of sub-pixels of a display region. A signal input terminal of the Nth-level gate drive sub-circuit GOA (N) may be electrically connected with a start signal line STV. A connection relationship between gate drive sub-circuits is not limited in this example. For example, an output signal of a signal output terminal of the (N+1)th-level gate drive sub-circuit may be provided to a signal input terminal of the (N+2)th-level gate drive sub-circuit, and may also be provided to a reset signal terminal of the Nth-level gate drive sub-circuit.

In some examples, pulse periods of clock signals provided by the plurality of clock signal lines electrically connected with the gate drive circuit may be the same. At the same time when a pulse signal of a clock signal provided by a previous clock signal line ends, a pulse signal of a clock signal provided by a next clock signal line may be generated. For example, a first pulse signal of the first clock signal line is generated first, a first pulse signal of the second clock signal line is generated when the first pulse signal ends, a first pulse signal of the third clock signal line is generated when the first pulse signal of the second clock signal line ends, a first pulse signal of the fourth clock signal line is generated when the first pulse signal of the third clock signal line ends, a first pulse signal of the fifth clock signal line is generated when the first pulse signal of the fourth clock signal line ends, a first pulse signal of the sixth clock signal line is generated when the first pulse signal of the fifth clock signal line ends, a second pulse signal of the first clock signal line is generated when the first pulse signal of the sixth clock signal line ends, and so on.

In some examples, as shown in FIG. 6, the clock signal line may be electrically connected with the gate drive circuit through a connecting line. In order to minimize a trace load, the connecting line is usually laid according to a shortest trace path. A length of a connecting line corresponding to a clock signal line close to the gate drive circuit is relatively short and a corresponding line resistance is relatively small. A plurality of connecting lines connecting different clock signal lines are taken as a group. In a group of connecting lines, each connecting line has a different length, and a length of a connecting line corresponding to a clock signal line away from the gate drive circuit is relatively long, and a corresponding line resistance is relatively great. When a clock signal is transmitted, losses caused by different magnitudes of resistances are different. In this way, clock signals transmitted to the gate drive circuit are different, so that falling edges of scan signals received by a pixel circuit in the display region are different, thus affecting ΔVp, resulting in poor display of horizontal stripes generated in the display region. Taking a case that the gate drive circuit shown in FIG. 6 is electrically connected with six clock signal lines (for example, the first clock signal line CK1 to the sixth clock signal line CLK6) as an example, a line segment resistance of a connecting line electrically connecting two adjacent clock signal lines is ΔR, then a difference between a connecting line electrically connected with the first clock signal line CLK1 and a connecting line electrically connected with the sixth clock signal line CLK6 is 5×ΔR, in this way, a dividing line caused by brightness difference will be generated at a junction of a sub-pixel row connected with a gate drive sub-circuit (e.g., GOA(N+6)) electrically connected with the first clock signal line CLK1 and a sub-pixel row connected with a gate drive sub-circuit (e.g., GOA(N+7)) electrically connected with the sixth clock signal line CLK. In a large-size display panel, the more clock signal lines are electrically connected with the gate drive circuit, the more obvious the above situation is.

This embodiment provides a display panel. By performing load compensation on a connecting line connected between a clock signal line and the gate drive circuit, loads of a plurality of connecting lines are approximately the same, and consistency of falling edges of a plurality of output signals of the gate drive circuit is ensured, thereby ensuring a display effect of the display panel.

This embodiment provides a display panel, including a base substrate, and a gate drive circuit, a plurality of clock signal lines, and a plurality of connecting lines that are disposed on the base substrate. The plurality of clock signal lines are located on a side of the gate drive circuit along a first direction and are arranged in sequence. Each connecting line is electrically connected with the gate drive circuit and a clock signal line. At least one connecting line includes a load adjusting portion configured to compensate for a load difference between different clock signal lines. An orthographic projection of the load adjusting portion of the at least one connecting line on the base substrate is at least partially overlapped with an orthographic projection of at least one clock signal line on the base substrate; or, each of the plurality of connecting lines includes a load adjusting portion, and load adjusting portions of the plurality of connecting lines are located on a side of the plurality of clock signal lines away from the gate drive circuit, or located on a side of the plurality of clock signal lines close to the gate drive circuit, or located within a spacing region between two adjacent clock signal lines.

In some exemplary implementation modes, an orthographic projection of a load adjusting portion of at least one connecting line on the base substrate may be at least partially overlapped with an orthographic projection of a clock signal line with which the load adjusting portion is connected on the base substrate. For example, the orthographic projection of the load adjusting portion of the at least one connecting line on the base substrate may be within a range of the orthographic projection of the clock signal line with which the load adjusting portion is connected on the base substrate. In this example, by disposing a load adjusting portion within a range of the orthographic projection of a clock signal line, not only may a load difference between different clock signal lines be compensated, but also occupation of trace space may be avoided, which is beneficial to saving space and avoiding interference with traces other than the clock signal line.

In some exemplary implementation modes, an orthographic projection of load adjusting portions of the plurality of connecting lines on the base substrate and an orthographic projection of the plurality of clock signal lines on the base substrate may not be overlapped, and setting positions of the load adjusting portions of the plurality of connecting lines may be the same with respect to the gate drive circuit and the plurality of clock signal lines. For example, the load adjusting portions of the plurality of connecting lines may all be located on a side of the plurality of clock signal lines away from the gate drive circuit; or, the load adjusting portions of the plurality of connecting lines may all be located on a side of the plurality of clock signal lines close to the gate drive circuit; or, the load adjusting portions of the plurality of connecting lines may all be located within a spacing region between two adjacent clock signal lines. In this example, by disposing all the load adjusting portions on the side of the clock signal lines away from the gate drive circuit, not only may a load difference between different clock signal lines be compensated, but also an interference to the clock signal lines may be avoided, which is also beneficial to saving trace space. Or, in this example, by disposing all the load adjusting portions on the side of the clock signal lines away from the gate drive circuit, not only may a load difference between different clock signal lines be compensated, but also an interference to the clock signal lines may be avoided, and an influence of large static electricity brought by too long clock signal lines on transistors within the gate drive circuit may also be reduced, which is also beneficial to saving trace space. Or, in this example, by disposing all the load adjusting portions within the spacing region between two adjacent signal lines, not only may a load difference between different clock signal lines be compensated, but also an interference to the clock signal lines may be avoided, and excessive lengths of the connecting lines may also be avoided, which is also beneficial to saving trace space. It is only necessary to increase the spacing region between two adjacent signal lines.

In some exemplary implementation modes, an orthographic projection of the load adjusting portions of the plurality of connecting lines on the base substrate may be overlapped with an orthographic projection of a same clock signal line on the base substrate. In this example, not only a load difference between different clock signal lines may be compensated, but also an interference to a clock signal line may be reduced, which is beneficial to saving trace space.

Solutions of this embodiment will be described below through multiple examples. In following examples, a part of clock signal lines within a left frame region of the display region and the gate drive circuit are taken as an example for illustration. In following examples, a case that the gate drive circuit is electrically connected with six clock signal lines is taken as an example.

Figure 7:
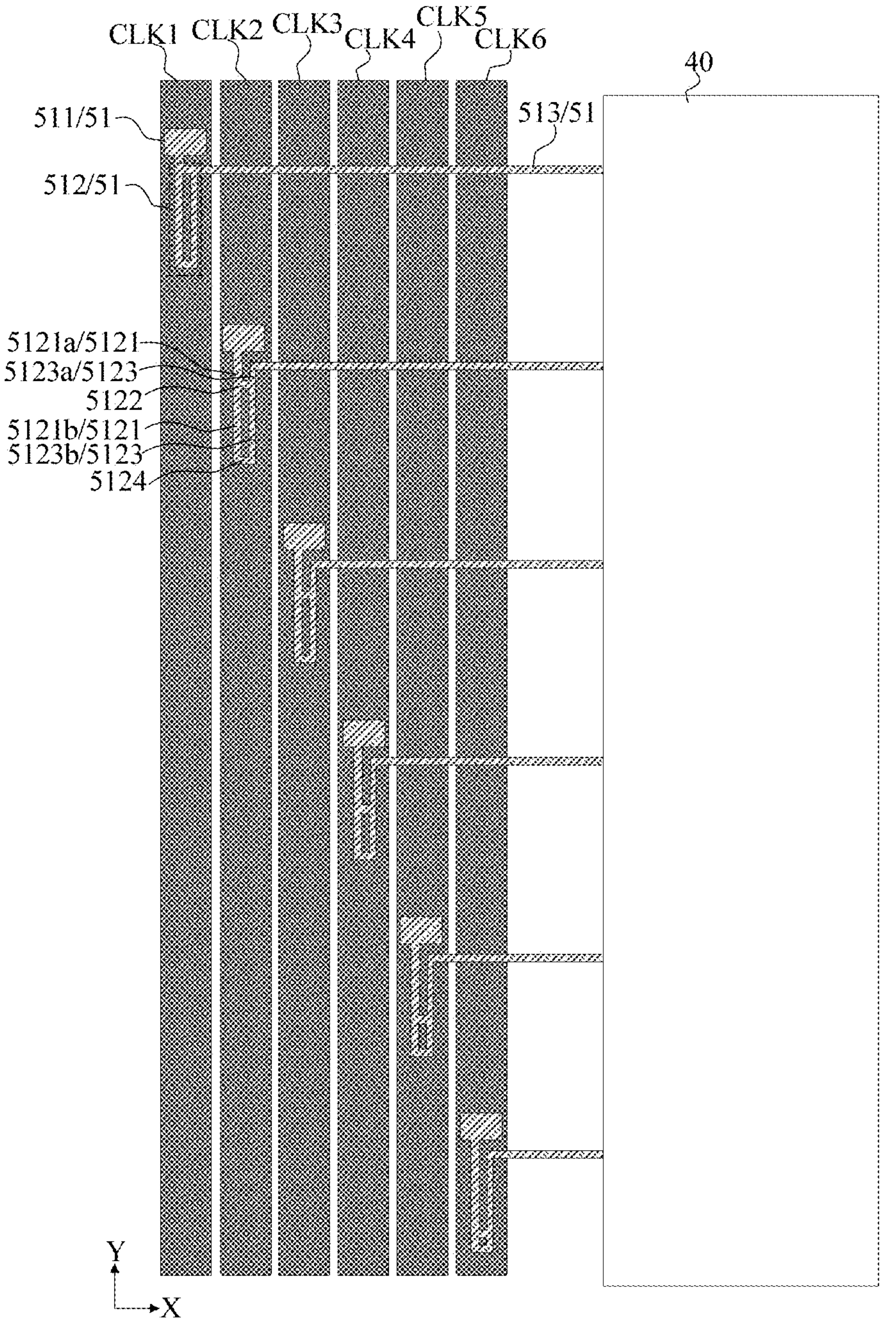
FIG. 7 is a partial schematic diagram of a display panel according to at least one embodiment of the present disclosure.

FIG. 7 is a partial schematic diagram of a display panel according to at least one embodiment of the present disclosure. In some examples, as shown in FIG. 7, six clock signal lines are electrically connected with a gate drive circuit 40, and may include, for example, a first clock signal line CLK1, a second clock signal line CLK2, a third clock signal line CLK3, a fourth clock signal line CLK4, a fifth clock signal line CLK5, and a sixth clock signal line CLK6. The six clock signal lines may extend along a second direction Y and are located on a side of the gate drive circuit 40 away from the display region along a first direction X. A plurality of gate drive sub-circuits included by the gate drive circuit 40 may be arranged sequentially along the second direction Y. However, this embodiment is not limited thereto. For example, a plurality of clock signal lines may be located on a side of the gate drive circuit close to a display region along the first direction; or some of the plurality of clock signal lines are located on a side of the gate drive circuit away from the display region, and the other of the plurality of clock signal lines are located on a side of the gate drive circuit close to the display region.

In some examples, as shown in FIG. 7, lengths of the plurality of clock signal lines along the first direction X may be substantially the same. Spacing between adjacent clock signal lines (i.e., spacing distances along the first direction X) may be substantially the same.

In some examples, as shown in FIG. 7, the plurality of clock signal lines may be electrically connected with the gate drive circuit 40 through a plurality of connecting lines 51, respectively. Two ends of a connecting line 51 may be electrically connected with a clock signal line and a clock signal terminal of a gate drive sub-circuit of the gate drive circuit, respectively. A clock signal line and a connecting line may be located in different film layers. For example, the clock signal line and a first source-drain metal layer of the display region may be disposed in a same layer, the connecting line and a first gate metal layer or a second gate metal layer of the display region may be disposed in a same layer, and the clock signal line may be electrically connected with the connecting line through a via provided in an insulation layer.

"A and B have a same layer structure" or "A and B are disposed in a same layer" mentioned in the embodiments of the present disclosure means that A and B are formed simultaneously through a same patterning process, or surfaces of A and B close to a base substrate have basically a same distance from the base substrate, or the surfaces of A and B close to the base substrate are in direct contact with a same film layer.

In some examples, as shown in FIG. 7, each of the connecting lines 51 may include a first connecting portion 511, a load adjusting portion 512, and a second connecting portion 513 that are connected in sequence. One end of the first connecting portion 511 is electrically connected with a corresponding clock signal line and the other end is connected with the load adjusting portion 512. One end of the second connecting portion 513 is electrically connected with a clock signal terminal of one gate drive sub-circuit of the gate drive circuit 40 and the other end is electrically connected with the other end of the load adjusting portion 512. An orthographic projection of the first connecting portion 511 on the base substrate may be rectangular, for example, the first connecting portion 511 may be electrically connected with a corresponding clock signal line through a via provided on an insulation layer. The second connecting portion 513 may be a straight line segment extending along the first direction X. Six connecting lines 51 electrically connected with six clock signal lines, respectively, and arranged continuously along the second direction Y are used as a group of connecting lines. In the group of connecting lines, shapes and sizes of first connecting portions 511 of the six connecting lines 51 may be substantially the same, lengths of second connecting portions 513 of the six connecting lines 51 along the first direction X may be different, and lengths of load adjusting portions 512 of the six connecting lines 51 along the second direction Y may be substantially the same.

In some examples, as shown in FIG. 7, a load adjusting portion 512 of each connecting line 51 may include a first sub-connecting portion 5121, a second sub-connecting portion 5122, a third sub-connecting portion 5123, and a fourth sub-connecting portion 5124. The first sub-connecting portion 5121 and the third sub-connecting portion 5123 may both extend along the second direction Y, and the second sub-connecting portion 5122 and the fourth sub-connecting portion 5124 may both extend along the first direction X. The second sub-connecting portion 5122 and the fourth sub-connecting portion 5124 may be connected between the first sub-connecting portion 5121 and the third sub-connecting portion 5123. One end of the first sub-connecting portion 5121 may be electrically connected with a first connecting portion 511 and the other end may be electrically connected with one end of the fourth sub-connecting portion 5124; and one end of the third sub-connecting portion 5123 may be electrically connected with a second connecting portion 513 and the other end may be electrically connected with the other end of the fourth sub-connecting portion 5124. The second sub-connecting portion 5122 may be located on a side of the fourth sub-connecting portion 5124 close to the first connecting portion 511. For example, the first sub-connecting portion 5121 may include a first sub-segment 5121*a* and a second sub-segment 5121*b*, two ends of first sub-segment 5121*a* may be electrically connected with the first sub-connecting portion 511 and the second sub-connecting portion 5122, respectively, and two ends of the second sub-segment 5121*b* may be electrically connected with the second sub-connecting portion 5122 and the fourth sub-connecting portion 5124, respectively. The third sub-connecting portion 5123 may include a third sub-segment 5123*a* and a fourth sub-segment 5123*b*, two ends of the third sub-segment 5123*a* are electrically connected with the second connecting portion 513 and the second sub-connecting portion 5122, respectively, and two ends of the fourth sub-segment 5123*b* may be electrically connected with the second sub-connecting portion 5122 and the fourth sub-connecting portion 5124, respectively.

In some examples, as shown in FIG. 7, in a group of connecting lines, lengths of first sub-connecting portions 5121 of load adjusting portions 512 of a plurality of connecting lines along the second direction Y may be substantially the same, lengths of third sub-connecting portions 5123 along the second direction Y may be substantially the same, and lengths of second sub-connecting portions 5122 and fourth sub-connecting portions 5124 along the first direction X may be substantially the same. A cross-sectional area of each portion of a connecting line in a direction perpendicular to the display panel may be approximately the same. A length of a first sub-connecting portion 5121 of a load adjusting portion 512 of one connecting line 51 along the second direction Y may be greater than a length of a third sub-connecting line 5123 along the second direction Y.

In some examples, as shown in FIG. 7, in a group of connecting lines, lengths of first sub-segments 5121*a* of first sub-connecting portions 5121 of load adjusting portions 512 of a plurality of connecting lines along the second direction Y may be different, and lengths of third sub-segments 5123*a* of third sub-connecting portions 5123 along the second direction Y may be different. Distances between second sub-connecting portions 5122 and fourth sub-connecting portions 5124 of the load adjusting portions 512 of the plurality of connecting lines may be different. Among them, a distance between a second sub-connecting portion 5122 and a fourth sub-connecting portion 5124 of a load adjusting portion 512 of a connecting line electrically connected with a clock signal line close to the gate drive circuit 40 is smaller than a distance between a second sub-connecting portion 5122 and a fourth sub-connecting portion 5124 of a load adjusting portion 512 of a connecting line electrically connected with a clock signal line away from the gate drive circuit 40. For example, a second sub-connecting portion 5122 of a load adjusting portion 512 of a connecting line 51 electrically connected with the first clock signal line CLK1 may be collinear with a second connecting portion 513, a distance between the two along the second direction Y may be 0, and a length of a third sub-segment 5123*a* of a third sub-connecting portion 5123 of the load adjusting portion 512 may be 0. For example, a distance between a second sub-connecting portion 5122 and a fourth sub-connecting portion 5124 of a load adjusting portion 512 of a connecting line 51 electrically connected with the sixth clock signal line CLK6 may be smaller than a distance between the second sub-connecting portion 5122 and a second connecting portion 513, and a length of a third sub-segment 5123*a* of a third sub-connecting portion 5123 of the load adjusting portion 512 may be greater than a length of a fourth sub-segment 5123*b*.

In some examples, a calculation formula for a trace resistance is R=ρL/S, wherein R is a resistance value, P is a resistivity, L is an equivalent length of a trace, and S is a cross-sectional area of the trace. Therefore, under a situation that a plurality of portions of a plurality of connecting lines have a same resistivity and a same cross-sectional area, their resistances are determined by their equivalent lengths, and the resistances of the plurality of connecting lines may be made consistent by setting the equivalent lengths of the plurality of connecting lines to be consistent. As shown in FIG. 7, an equivalent length of each connecting line may be a sum of a length of a first sub-segment 5121*a* of a first sub-connecting portion 5121 of a load adjusting portion 512 along the second direction Y, a length of a second sub-connecting portion 5122 along the first direction X, a length of a third sub-segment 5123*a* of a third sub-connecting portion 5123 along the second direction Y, and a length of a second connecting portion 513 along the first direction X. In this example, by adjusting a position of a second sub-connecting portion of a load adjusting portion, resistance compensation may be performed on connecting lines connected with different clock signal lines, so that resistances of the connecting lines connected with different clock signal lines are basically the same, and a falling edge difference of an output signal of the gate drive circuit caused by a resistance difference of a connecting line is improved.

In some examples, as shown in FIG. 7, an orthographic projection of a first connecting portion 511 and a load adjusting portion 512 of each connecting line 51 on the base substrate may be overlapped with an orthographic projection of a connected clock signal line on the base substrate, for example, within a range of the orthographic projection of the connected clock signal line on the base substrate. An orthographic projection of a second connecting portion 513 of the connecting line 51 on the base substrate may be overlapped with an orthographic projection of at least one clock signal line on the base substrate. In this example, overlapping areas of orthographic projections of load adjusting portions 512 of a plurality of connecting lines 51 on the base substrate and orthographic projections of clock signal lines may be substantially the same, so that parasitic capacitances between the plurality of connecting lines 51 and the clock signal lines may be substantially the same.

According to the display panel of this example, load adjusting portions are used for compensating for a length difference of different connecting lines due to different distances between a plurality of clock signal lines and the gate drive circuit, so that resistances of a plurality of connecting lines may be approximately the same, and a falling edge difference of an output signal of the gate drive circuit caused by a resistance difference of a connecting line is improved. Moreover, an orthographic projection of load adjusting portions of the plurality of connecting lines is located in a range of an orthographic projection of connected clock signal lines on the base substrate, there is no need to increase arrangement space of the load adjusting portions, occupied space of the gate drive circuit will not be increased, a range of a frame region will not be increased, and a trace other than the clock signal lines will not be interfered.

Figure 8:
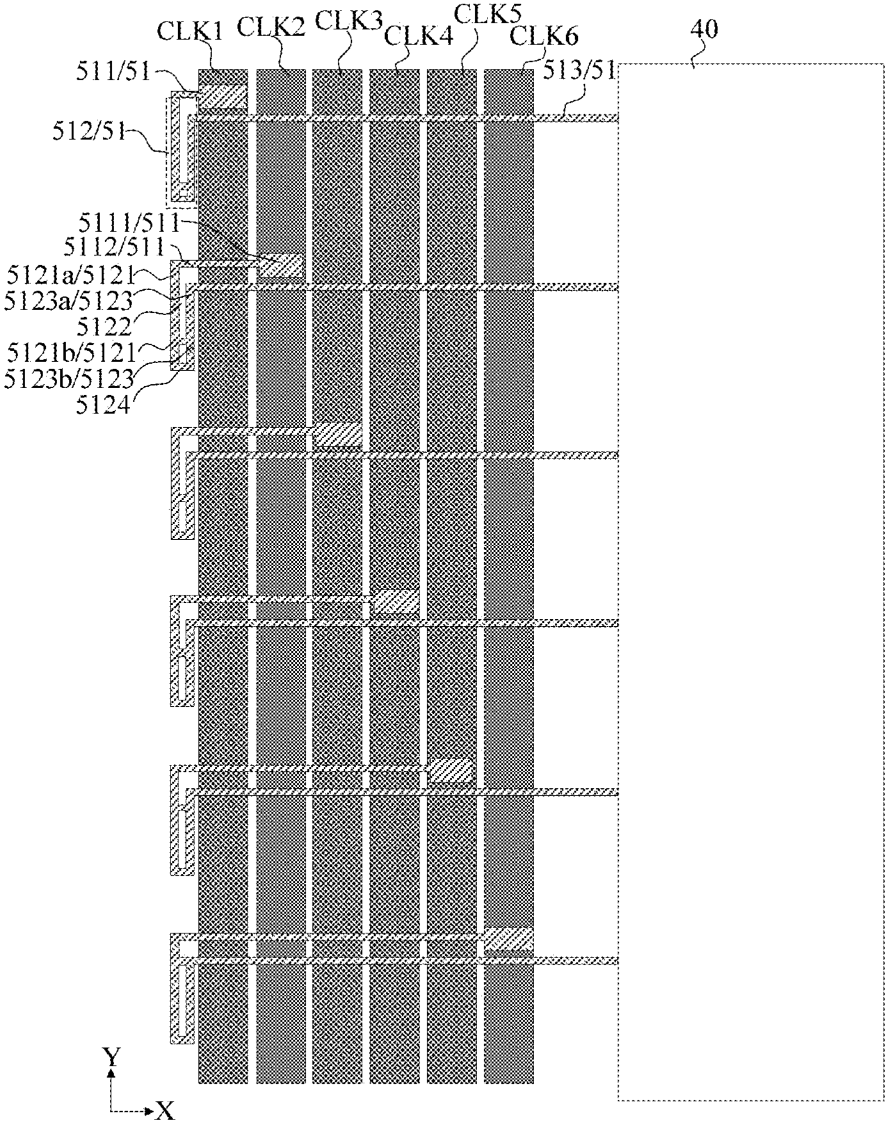
FIG. 8 is another partial schematic diagram of a display panel according to at least one embodiment of the present disclosure.

FIG. 8 is another partial schematic diagram of a display panel according to at least one embodiment of the present disclosure. In some examples, as shown in FIG. 8, each connecting line 51 may include a first connecting portion 511, a load adjusting portion 512, and a second connecting portion 513 that are connected in sequence. The first connecting portion 511 may include a first connecting block 5111 and a first connecting strip 5112 which are connected with each other. The first connecting block 5111 is electrically connected with a corresponding clock signal line. An orthographic projection of the first connecting block 5111 on the base substrate may be rectangular and overlapped with an orthographic projection of the connected clock signal line on the base substrate, for example, located within a range of the orthographic projection of the connected clock signal line on the base substrate. The first connecting strip 5112 may have a strip structure extending along the first direction X and is electrically connected with one end of a first sub-connecting portion 5121 of a load adjusting portion 512.

In some examples, as shown in FIG. 8, load adjusting portions 512 of a plurality of connecting lines 51 may be located on a side of the six clock signal lines away from the gate drive circuit 40 in the first direction X, for example, a load adjusting portion 512 is adjacent to the first clock signal line CLK1. Lengths of third connecting portions 513 of the plurality of connecting lines 51 along the first direction X may be substantially the same.

In this example, an equivalent length of each connecting line 51 may be a sum of a length of a first connecting strip 5112 of a first connecting portion 511 along the first direction X, a length of a first sub-segment 5121*a* of a first sub-connecting portion 5121 of a load adjusting portion 512 along the second direction Y, a length of a second sub-connecting portion 5122 along the first direction X, a length of a third sub-segment 5123*a* of a third sub-connecting portion 5123 along the second direction Y, and a length of a second connecting portion 513 along the first direction X. For example, a length of a first connecting strip 5112 of a first connecting portion 511 of the first clock signal line CLK1 is relatively short, and a winding length of a load adjusting portion 512 is relatively long. A length of a first connecting strip 5112 of a first connecting portion 511 of the sixth clock signal line CLK6 is relatively long, and a winding length of a load adjusting portion 512 is relatively short.

According to the display panel of this example, a length difference of different connecting lines due to different distances between the plurality of clock signal lines and the gate drive circuit is compensated by using a winding structure of a load adjusting portion located on a side of the plurality of clock signal lines away from the gate drive circuit, so that resistances of a plurality of connecting lines may be approximately the same, and a falling edge difference of an output signal of the gate drive circuit caused by a resistance difference of a connecting line is improved. Moreover, load adjusting portions of the plurality of connecting lines are located on a side of the plurality of clock signal lines away from the gate drive circuit, which may reduce occupation of trace space. Lengths of third sub-connecting portions 5123 of the load adjusting portions of the plurality of connecting lines along the second direction Y are approximately the same, so that side surface areas of a connecting line and an adjacent clock signal line (i.e., the first clock signal line CLK1) are consistent, and side capacitances between the plurality of connecting lines and adjacent clock signal lines are guaranteed to be consistent. In other examples, for the load adjusting portions of the plurality of connecting lines, a fourth sub-connecting portion and a second sub-segment of a first sub-connecting portion may be omitted.

Rest of a structure of the display panel according to the embodiment may be referred to description of the aforementioned embodiments, and will not be repeated here.

Figure 9:
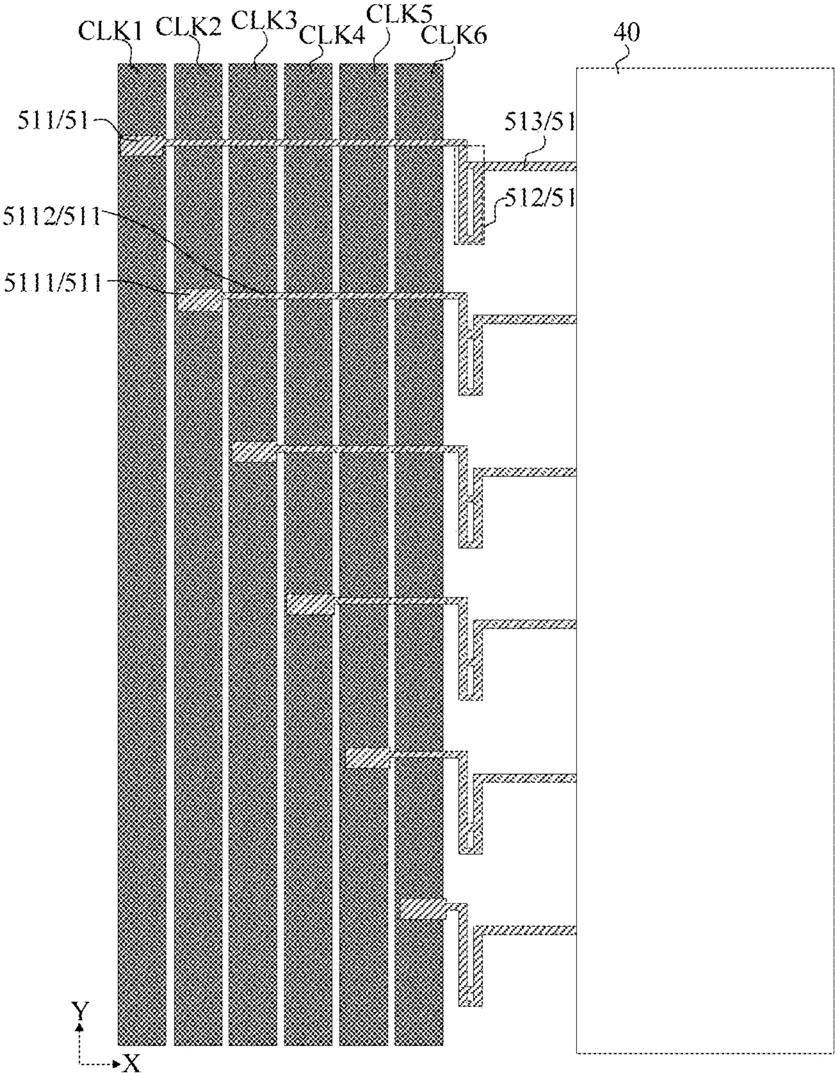
FIG. 9 is another partial schematic diagram of a display panel according to at least one embodiment of the present disclosure.

FIG. 9 is another partial schematic diagram of a display panel according to at least one embodiment of the present disclosure. In some examples, as shown in FIG. 9, each connecting line 51 may include a first connecting portion 511, a load adjusting portion 512, and a second connecting portion 513 that are connected in sequence. The first connecting portion 511 may include a first connecting block 5111 and a first connecting strip 5112 which are connected with each other. Load adjusting portions 512 of a plurality of connecting lines 51 may be located on a side of the six clock signal lines close to the gate drive circuit 40. For example, the load adjusting portions 512 of the plural connecting lines 51 are located between the six clock signal lines and the gate drive circuit 40, for example, adjacent to the sixth clock signal line CLK6.

In some examples, as shown in FIG. 9, second connecting portions 513 of the plurality of connecting lines 51 extend along the first direction X and have substantially a same length along the first direction X. First connecting blocks 5111 of first connecting portions 511 of the plurality of connecting lines 51 have substantially a same shape and size. First connecting strips 5112 of the first connecting portions 511 of the plurality of connecting lines 51 extend along the first direction X and have different lengths along the first direction X. A length of a first connecting strip 5112 of a first connecting portion 511 of a connecting line 51 electrically connected with a clock signal line close to the gate drive circuit along the first direction X is smaller than a length of a first connecting strip 5112 of a first connecting portion 511 of a connecting line 51 electrically connected with a clock signal line away from the gate drive circuit along the first direction X. For example, a length of a first connecting strip 5112 of a first connecting portion 511 of a connecting line 51 electrically connected with the sixth clock signal line CLK6 along the first direction X is the smallest, and a length of a first connecting strip 5112 of a first connecting portion 511 of a connecting line 51 electrically connected with the first clock signal line CLK1 along the first direction X is the largest.

In this example, load adjusting portions located between the gate drive circuit and the plurality of clock signal lines are used for compensating for a length difference of different connecting lines due to different distance between the plurality of clock signal lines and the gate drive circuit, so that resistances of the plurality of connecting lines may be approximately the same, and a falling edge difference of an output signal of the gate drive circuit caused by a resistance difference of a connecting line is improved. Moreover, by disposing the load adjusting portions of the plurality of connecting lines between the plurality of clock signal lines and the gate drive circuit, a distance between a clock signal line and the gate drive circuit may be increased, thereby reducing an influence of static electricity caused by a clock signal line with an excessive length on a transistor within the gate drive circuit.

Rest of a structure of the display panel according to the embodiment may be referred to description of the aforementioned embodiments, and will not be repeated here.

Figure 10:
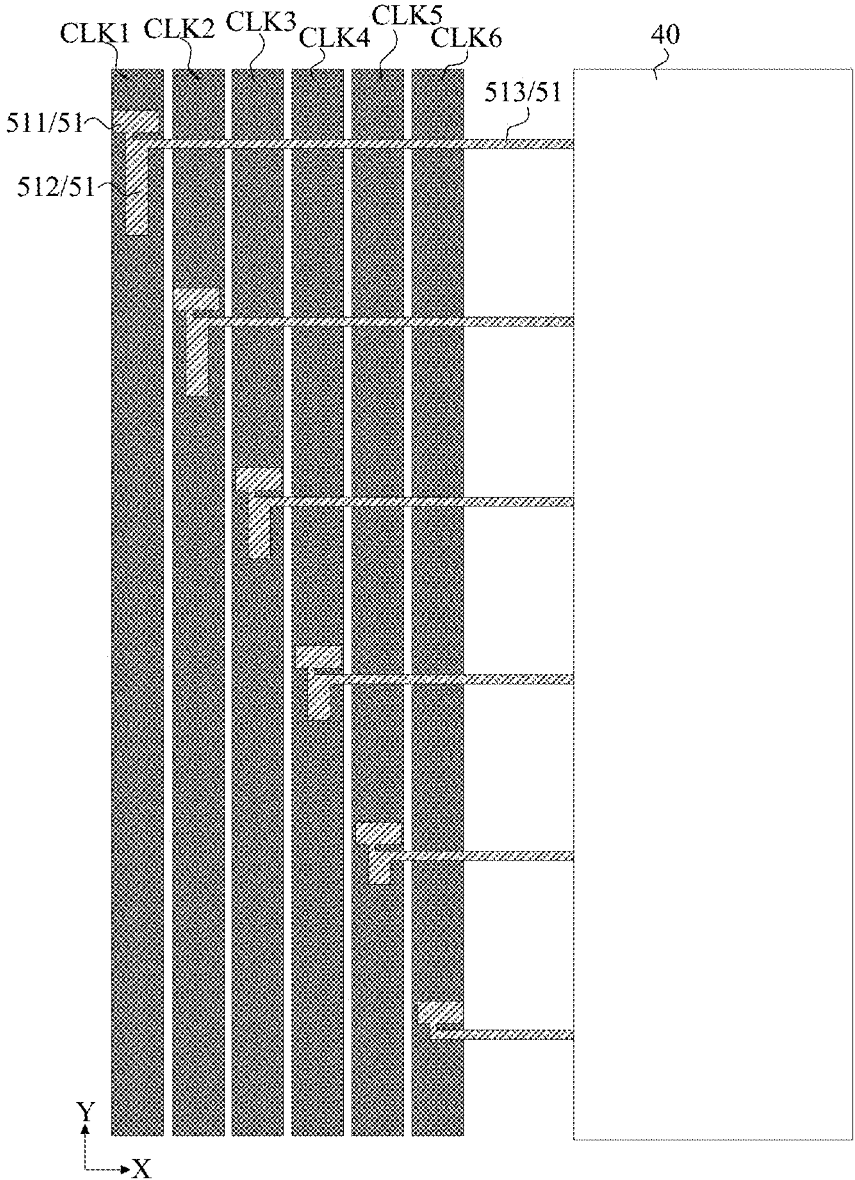
FIG. 10 is another partial schematic diagram of a display panel according to at least one embodiment of the present disclosure.

FIG. 10 is another partial schematic diagram of a display panel according to at least one embodiment of the present disclosure. In some examples, as shown in FIG. 10, each connecting line 51 may include a first connecting portion 511, a load adjusting portion 512, and a second connecting portion 513 that are connected in sequence. An orthographic projection of the first connecting portion 511 and the load adjusting portion 512 of each connecting line 51 on the base substrate may be overlapped with an orthographic projection of a connected clock signal line on the base substrate, for example, within a range of the orthographic projection of the connected clock signal line on the base substrate. An orthographic projection of the load adjusting portion 512 on the base substrate may be rectangular. Sizes of load adjusting portions 512 of different connecting lines 51 may be different. Overlapping areas of orthographic projections of the load adjusting portions 512 of the different connecting lines 51 on the base substrate and orthographic projections of connected clock signal lines on the base substrate may be different. An overlapping area of an orthographic projection of a load adjusting portion 512 of a connecting line 51 electrically connected with a clock signal line away from the gate drive circuit 40 on the base substrate and an orthographic projection of the clock signal line on the base substrate may be greater than an overlapping area of an orthographic projection of a load adjusting portion 512 of a connecting line 51 electrically connected with a clock signal line close to the gate drive circuit 40 on the base substrate and an orthographic projection of the clock signal line on the base substrate. For example, an overlapping area of an orthographic projection of a load adjusting portion 512 of a connecting line 51 electrically connected with the first clock signal line CLK1 on the base substrate and an orthographic projection of the first clock signal line CLK1 on the base substrate is the largest, and an overlapping area of an orthographic projection of a load adjusting portion 512 of a connecting line 51 electrically connected with the sixth clock signal line CLK6 on the base substrate and an orthographic projection of the sixth clock signal line CLK6 on the base substrate is the smallest.

In some examples, as shown in FIG. 10, lengths of load adjusting portions 512 of a plurality of connecting lines 51 may be substantially the same along the first direction X, and may be different along the second direction Y. By increasing a length of a load adjusting portion 512 of a connecting line 51 connected with a clock signal line away from the gate drive circuit 40 along the second direction Y, an area of the load adjusting portion 512 may be increased, and a line resistance of the connecting line 51 may be guaranteed to be reduced, thereby reducing a loss of a clock signal.

Rest of a structure of the display panel according to the embodiment may be referred to description of the aforementioned embodiments, and will not be repeated here.

Figure 11:
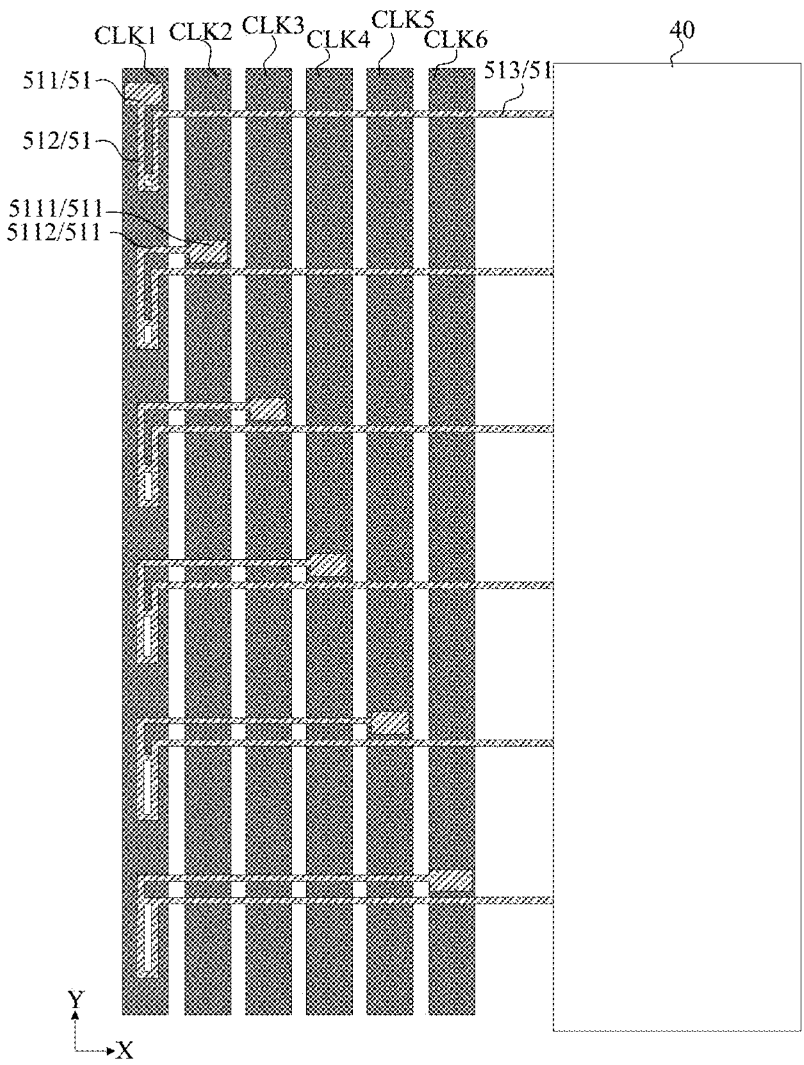
FIG. 11 is another partial schematic diagram of a display panel according to at least one embodiment of the present disclosure.

FIG. 11 is another partial schematic diagram of a display panel according to at least one embodiment of the present disclosure. In some examples, as shown in FIG. 11, each connecting line 51 may include a first connecting portion 511, a load adjusting portion 512, and a second connecting portion 513 that are connected in sequence. The first connecting portion 511 may include a first connecting block 5111 and a first connecting strip 5112 which are connected with each other. Orthographic projections of load adjusting portions 512 of a plurality of connecting lines 51 on the base substrate are all overlapped with an orthographic projection of the first clock signal line CLK1 on the base substrate, for example, within a range of the orthographic projection of the first clock signal line CLK1 on the base substrate. However, this embodiment is not limited thereto. In other examples, the orthographic projections of the load adjusting portions 512 of the plurality of connecting lines 51 on the base substrate may be overlapped with an orthographic projection of one or more of the second clock signal line CLK2 to the sixth clock signal line CLK6 on the base substrate.

Rest of a structure of the display panel according to the embodiment may be referred to description of the aforementioned embodiments, and will not be repeated here.

Figure 12:
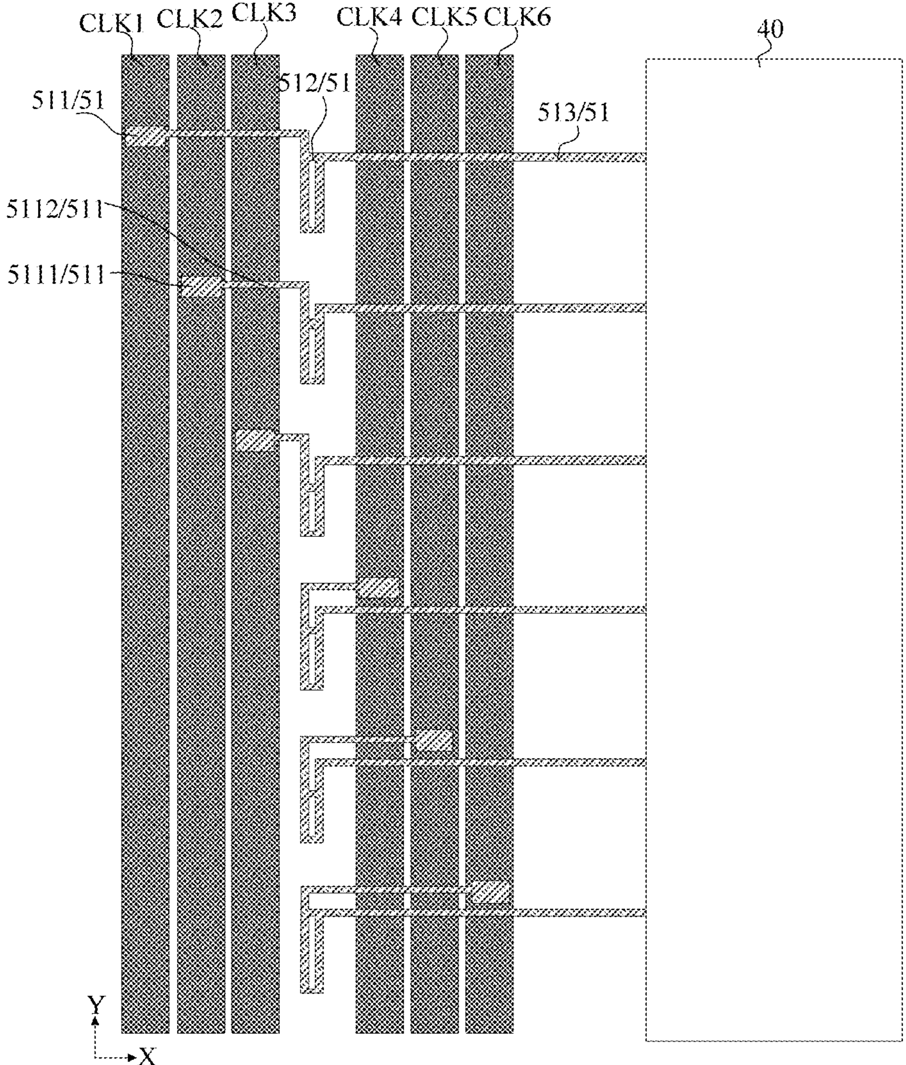
FIG. 12 is another partial schematic diagram of a display panel according to at least one embodiment of the present disclosure.

FIG. 12 is another partial schematic diagram of a display panel according to at least one embodiment of the present disclosure. In some examples, as shown in FIG. 12, each connecting line 51 may include a first connecting portion 511, a load adjusting portion 512, and a second connecting portion 513 that are connected in sequence. The first connecting portion 511 may include a first connecting block 5111 and a first connecting strip 5112 which are connected with each other. Load adjusting portions 512 of a plurality of connecting lines 51 may be located between the third clock signal line CLK3 and the fourth clock signal line CLK4. For example, a first connecting strip 5112 of a first connecting portion 511 of a connecting line 51 connected with the first clock signal line CLK1 to the third clock signal line CLK3 may extend along the first direction X to a side close to the gate drive circuit 40, and a first connecting strip 5112 of a first connecting portion 511 of a connecting line 51 connected with the fourth clock signal line CLK4 to the sixth clock signal line CLK6 may extend along the first direction X to a side away from the gate drive circuit 40. However, this embodiment is not limited thereto. In other examples, the load adjusting portions 512 of the plurality of connecting lines 51 may all be located between the first clock signal line CLK1 and the second clock signal line CLK2, or may be located between the second clock signal line CLK2 and the third clock signal line CLK3, or may be located between the fourth clock signal line CLK4 and the fifth clock signal line CLK5, or may be located between the fifth clock signal line CLK5 and the sixth clock signal line CLK6. In other examples, a load adjusting portion of at least one of the plurality of connecting lines may be located between the first clock signal line CLK1 and the second clock signal line CLK2, and a load adjusting portion of at least one connecting line may be located between the fifth clock signal line CLK5 and the sixth clock signal line CLK6. In other examples, a load adjusting portion may be disposed between the first clock signal line CLK1 and the second clock signal line CLK2, between the third clock signal line CLK3 and the fourth clock signal line CLK4, and between the fifth clock signal line CLK5 and the sixth clock signal line CLK6.

Rest of a structure of the display panel according to the embodiment may be referred to description of the aforementioned embodiments, and will not be repeated here.

Figure 13:
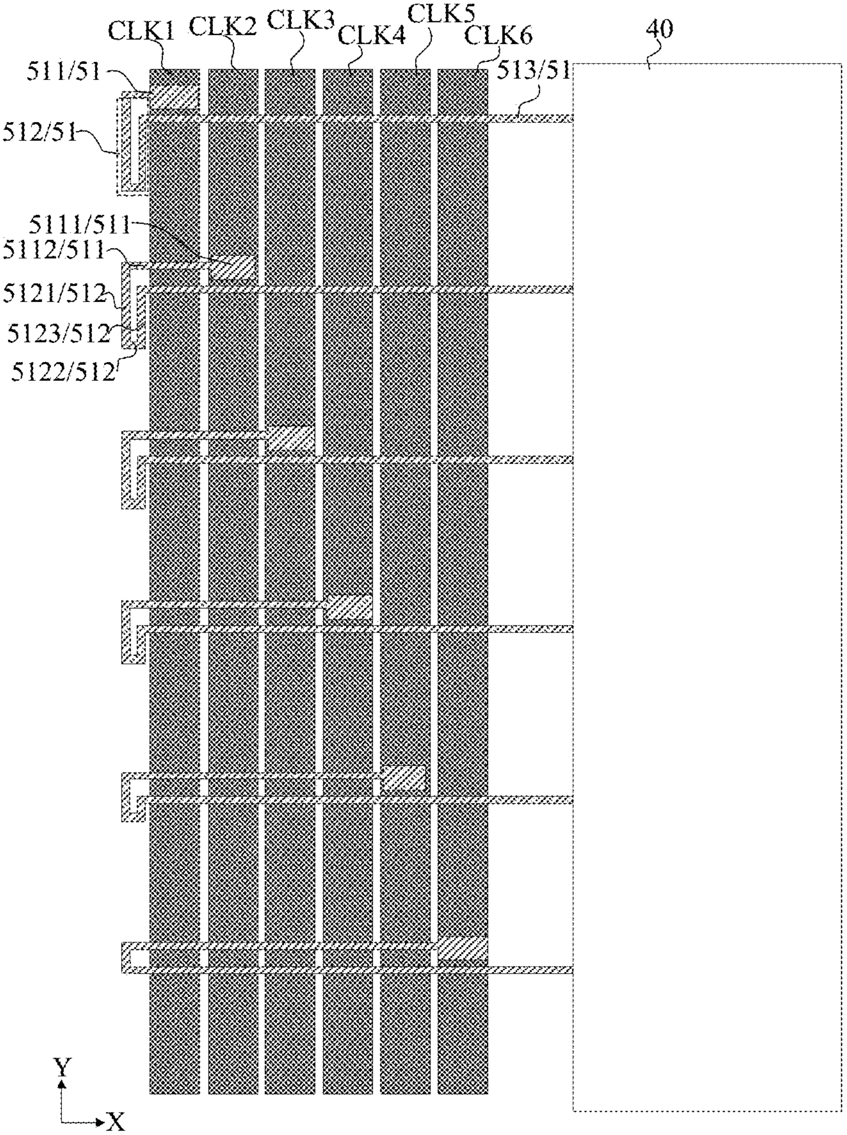
FIG. 13 is another partial schematic diagram of a display panel according to at least one embodiment of the present disclosure.

FIG. 13 is another partial schematic diagram of a display panel according to at least one embodiment of the present disclosure. In some examples, as shown in FIG. 13, each connecting line 51 may include a first connecting portion 511, a load adjusting portion 512, and a second connecting portion 513 that are connected in sequence. The first connecting portion 511 may include a first connecting block 5111 and a first connecting strip 5112 which are connected with each other. The load adjusting portion 512 may include a first sub-connecting portion 5121, a second sub-connecting portion 5122, and a third sub-connecting portion 5123 that re connected in sequence. The first sub-connecting portion 5121 and the third sub-connecting portion 5123 extend along the second direction Y, the first sub-connecting portion 5121 is connected with the first connecting strip 5112 of the first connecting portion 511, and the third sub-connecting portion 5123 is connected with the second connecting portion 513. The second sub-connecting portion 5122 extends along the first direction X and is connected between the first sub-connecting portion 5121 and the third sub-connecting portion 5123.

In some examples, as shown in FIG. 13, load adjusting portions 512 of a plurality of connecting lines 51 are located on a side of a plurality of clock signal lines away from the gate drive circuit 40. For example, the load adjusting portions 512 of the plurality of connecting lines 51 are adjacent to the first clock signal line CLK1.

According to the display panel of this example, a length difference of different connecting lines due to different distances between the plurality of clock signal lines and the gate drive circuit is compensated by using a winding structure of a load adjusting portion located on a side of the plurality of clock signal lines away from the gate drive circuit, so that resistances of the plurality of connecting lines may be approximately the same, and a falling edge difference of an output signal of the gate drive circuit caused by a resistance difference of a connecting line is improved.

Rest of a structure of the display panel according to the embodiment may be referred to description of the aforementioned embodiments, and will not be repeated here.

The above examples are for illustration only. In other examples, the above examples may be combined. For example, at least two arrangement manners in FIG. 7 to FIG. 13 may be adopted for load adjusting portions of a group of connecting lines. For example, an arrangement manner shown in FIG. 7 may be adopted for a load adjusting portion of at least one connecting line in a group of connecting lines, and an arrangement manner shown in any one of FIG. 8 to FIG. 13 may be adopted for a load adjusting portion of at least one connecting line. For another example, an arrangement manner shown in FIG. 10 may be adopted for a load adjusting portion of at least one connecting line in a group of connecting lines, and an arrangement manner shown in any one of FIG. 7 to FIG. 9 and FIG. 11 to FIG. 13 may be adopted for load adjusting portions of remaining connecting lines. For another example, an arrangement manner shown in FIG. 8 may be adopted for a load adjusting portion of at least one connecting line in a group of connecting lines, and an arrangement manner shown in FIG. 9 to FIG. 13 may be adopted for a load adjusting portion of at least one connecting line. This embodiment is not limited thereto.

Figure 14:
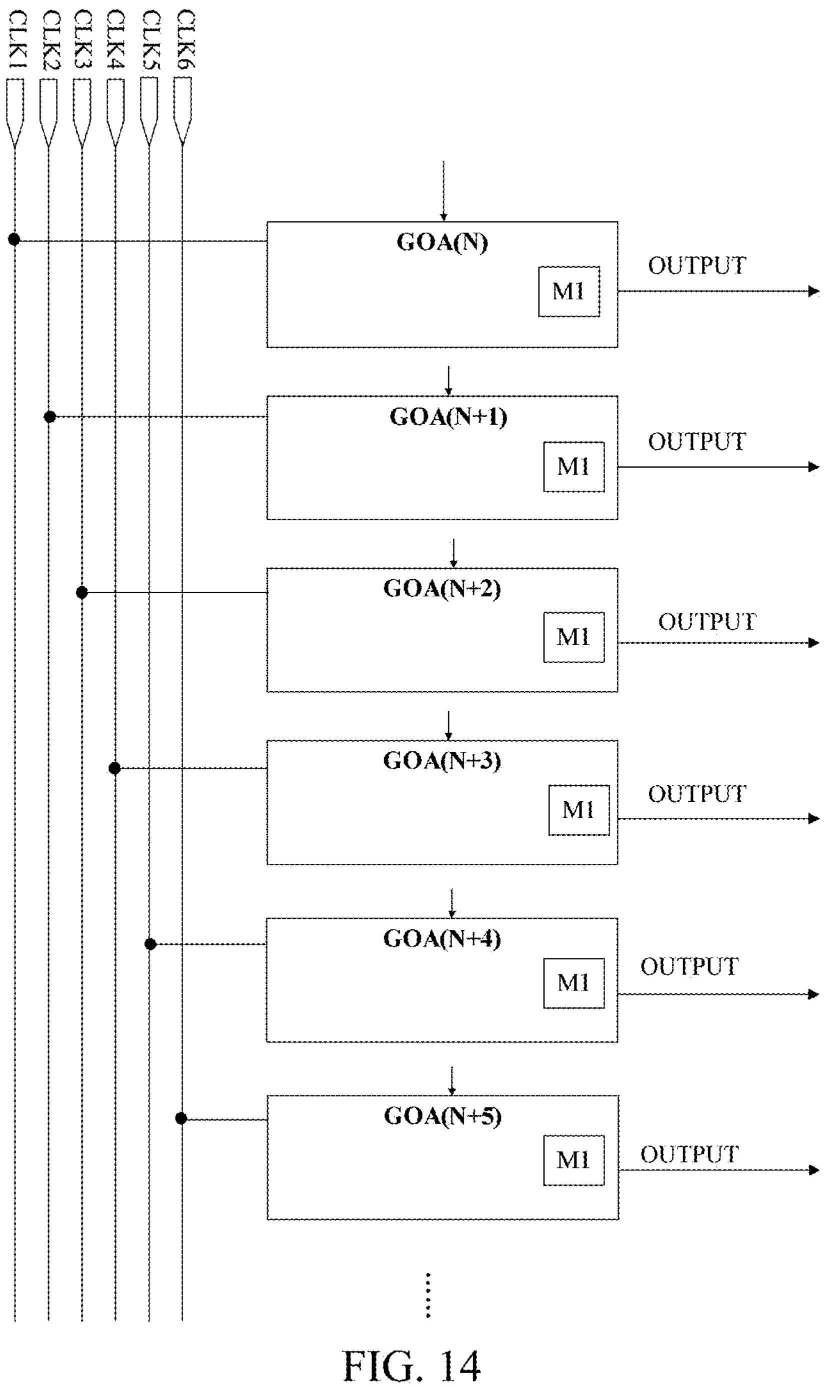
FIG. 14 is a schematic diagram of a gate drive circuit according to at least one embodiment of the present disclosure.

FIG. 14 is a schematic diagram of a gate drive circuit according to at least one embodiment of the present disclosure. In some examples, as shown in FIG. 14, the gate drive circuit includes a plurality of cascaded gate drive sub-circuits. The gate drive circuit may be electrically connected with a plurality of clock signal lines (including, for example, a first clock signal line CLK1 to a sixth clock signal line CLK6). A clock signal terminal of an Nth-level gate drive sub-circuit GOA(N) may be electrically connected with the first clock signal line CLK1, a clock signal terminal of an (N+1)th-level gate drive sub-circuit GOA(N+1) may be electrically connected with the second clock signal line CLK2, a clock signal terminal of an (N+2)th-level gate drive sub-circuit GOA(N+2) may be electrically connected with the third clock signal line CLK3, a clock signal terminal of an (N+3)th-level gate drive sub-circuit GOA(N+3) may be electrically connected with the fourth clock signal line CLK4, a clock signal terminal of an (N+4)th-level gate drive sub-circuit GOA(N+4) may be electrically connected with the fifth clock signal line CLK5, and a clock signal terminal of an (N+5)th-level gate drive sub-circuit GOA(N+5) may be electrically connected with the sixth clock signal line CLK6. In this example, six gate drive sub-circuits may be taken as a group to be electrically connected with six clock signal lines (i.e., the first clock signal line CLK1 to the sixth clock signal line CLK6), respectively. Every six gate drive sub-circuits may be used as a cycle, and so on. Among them, N is a positive integer.

In some examples, as shown in FIG. 14, each gate drive sub-circuit may at least include a first output transistor M1, which may be configured to provide a clock signal to a signal output terminal OUTPUT of the gate drive sub-circuit. For example, an equivalent circuit of the gate drive sub-circuit may be shown in FIG. 4, and the first output transistor M1 may provide a clock signal supplied by a clock signal terminal CLK to the signal output terminal OUTPUT under control of a first control node Q.

In some examples, a size of a first output transistor of a gate drive sub-circuit electrically connected with a clock signal line away from the gate drive circuit may be greater than a size of a first output transistor of a gate drive sub-circuit electrically connected with a clock signal line close to the gate drive circuit. As shown in FIG. 14, the first clock signal line CLK1 to the sixth clock signal line CLK6 are sequentially close to the gate drive circuit, wherein the first clock signal line CLK1 is farthest away from the gate drive circuit and the sixth clock signal line CLK6 is closest to the gate drive circuit. Sizes of first output transistors of gate drive sub-circuits electrically connected with the first clock signal line CLK1 to the sixth clock signal line CLK1 may be gradually reduced. Among them, a size of a first output transistor M1 of the gate drive sub-circuit GOA(N) may be larger than a size of a first output transistor M1 of the gate drive sub-circuit GOA(N+1), the size of the first output transistor M1 of the gate drive sub-circuit GOA(N+1) may be larger than a size of a first output transistor M1 of the gate drive sub-circuit GOA(N+2), the size of the first output transistor M1 of the gate drive sub-circuit GOA(N+2) may be larger than a size of a first output transistor M1 of the gate drive sub-circuit GOA(N+3), the size of the first output transistor M1 of the gate drive sub-circuit GOA(N+3) may be larger than a size of a first output transistor M1 of the gate drive sub-circuit GOA(N+4), and the size of the first output transistor M1 of the gate drive sub-circuit GOA(N+4) may be larger than a size of a first output transistor M1 of the gate drive sub-circuit GOA(N+5). Among them, the size of the first output transistor M1 of the gate drive sub-circuit GOA(N) may be the largest, and the size of the first output transistor M1 of the gate drive sub-circuit GOA(N+5) may be the smallest. In this example, the larger the resistance of a connecting line between a gate drive sub-circuit and a clock signal line, the larger the size of a first output transistor of the gate drive sub-circuit, thereby improving a falling edge difference of an output signal of the gate drive circuit caused by increase of the resistance of the connecting line.

In some examples, a size of a first output transistor may be an aspect ratio (W/L) of an active layer of the first output transistor. Among them, a length of the active layer of the first output transistor may be a length of the active layer in an extension direction, and a width may be a length of the active layer in a direction perpendicular to the extension direction within an extension plane.

In this example, in view of a resistance difference caused by a length difference of a connecting line between different clock signal lines and the gate drive circuit, by adjusting a size of a first output transistor of a gate drive sub-circuit, a falling edge difference of an output signal of the gate drive circuit caused by a resistance difference of a connecting line may be improved.

Figure 15:
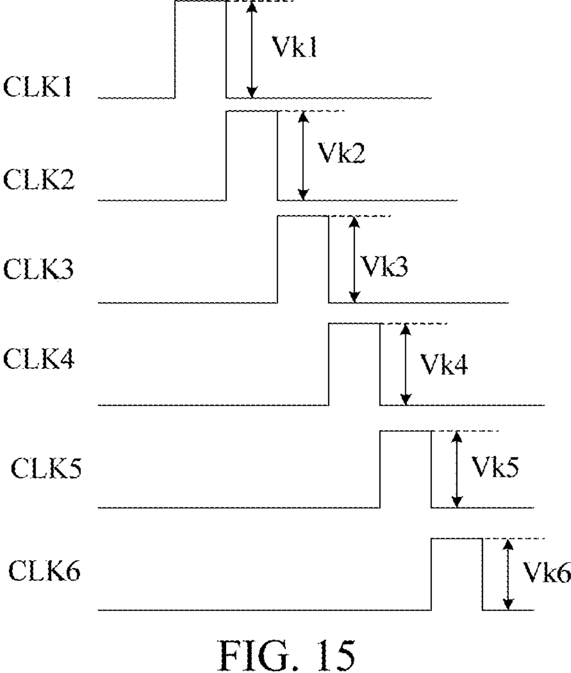
FIG. 15 is a schematic diagram of a clock signal according to at least one embodiment of the present disclosure.

FIG. 15 is a schematic diagram of a clock signal according to at least one embodiment of the present disclosure. In some examples, as shown in FIG. 15, a voltage amplitude of a clock signal supplied by the first clock signal line CLK1 is Vk1, a voltage amplitude of a clock signal supplied by the second clock signal line CLK2 is Vk2, a voltage amplitude of a clock signal supplied by the third clock signal line CLK3 is Vk3, a voltage amplitude of a clock signal supplied by the fourth clock signal line CLK4 is Vk4, a voltage amplitude of a clock signal supplied by the fifth clock signal line CLK5 is Vk5, and a voltage amplitude of a clock signal supplied by the sixth clock signal line CLK6 is Vk6. A voltage amplitude of a clock signal in this example refers to an absolute value of a difference between a high potential voltage and a low potential voltage of the clock signal. The voltage amplitude of the clock signal may be achieved by adjusting at least one of the high potential voltage and the low potential voltage of the clock signal. For example, the voltage amplitude is increased by increasing the high potential voltage and keeping the low potential voltage unchanged; or, the voltage amplitude is increased by decreasing the low potential voltage and keeping the high potential voltage unchanged; or, the voltage amplitude is increased by increasing the high potential voltage and decreasing the low potential voltage. This embodiment is not limited thereto.

In some examples, in view of a resistance difference caused by a length difference of a connecting line between different clock signal lines and the gate drive circuit, a falling edge difference of an output signal of the gate drive circuit caused by a resistance difference of a connecting line may be improved by adjusting voltage amplitudes of clock signals transmitted by different clock signal lines. As shown in FIG. 15, taking a case that resistances of connecting lines electrically connected the first clock signal line CLK1 to the sixth clock signal line CLK6 are gradually decreased as an example, a voltage amplitude of a clock signal transmitted by the first clock signal line CLK1 to a voltage amplitude of a clock signal transmitted by the sixth clock signal line CLK6 may be gradually decreased. Among them, the voltage amplitude Vk1 of the clock signal transmitted by the first clock signal line CLK1 may be the largest, and the voltage amplitude Vk6 of the clock signal transmitted by the sixth clock signal line CLK6 may be the smallest.

In other examples, the above embodiments may be combined. For example, a falling edge difference of an output signal of the gate drive circuit caused by a resistance difference of a connecting line is improved by combining a load adjusting portion of the connecting line and size adjustment of a first output transistor of a gate drive sub-circuit. For another example, a falling edge difference of an output signal of the gate drive circuit caused by a resistance difference of a connecting line is improved by combining a load adjusting portion of the connecting line and voltage amplitude adjustment of different clock signals. For yet another example, a falling edge difference of an output signal of the gate drive circuit caused by a resistance difference of a connecting line is improved by combining a load adjusting portion of the connecting line, size adjustment of a first output transistor of a gate drive sub-circuit, and voltage amplitude adjustment of different clock signals. This embodiment is not limited thereto.

An embodiment of the present disclosure also provides a display apparatus, including the display panel of the aforementioned embodiments.

Figure 16:
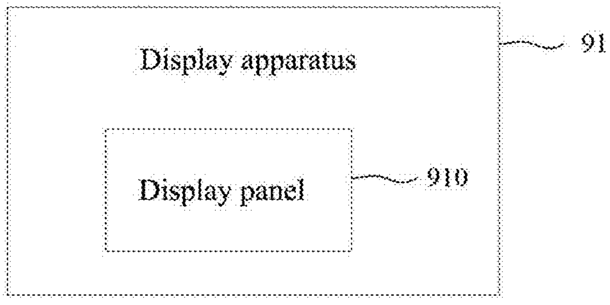
FIG. 16 is a schematic diagram of a display apparatus according to at least one embodiment of the present disclosure.

FIG. 16 is a schematic diagram of a display apparatus according to at least one embodiment of the present disclosure. In some examples, as shown in FIG. 16, a display panel 910 may be an OLED display panel. A display apparatus 91 may be any product or component with a display function, such as an OLED display apparatus, a mobile phone, a tablet computer, a television, a display, a notebook computer, a digital photo frame, or a navigator. However, this embodiment is not limited thereto.

The drawings of the present disclosure only involve structures involved in the present disclosure, and other structures may be referred to conventional designs. The embodiments of the present disclosure and features in the embodiments may be combined with each other to obtain new embodiments if there is no conflict. Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

From the foregoing, it will be appreciated that specific embodiments of the invention have been described herein for purposes of illustration, but that various modifications may be made without deviating from the scope of the invention. Accordingly, the invention is not limited except as by the appended claims.

The invention claimed is:

1. A display panel, comprising:

a base substrate, and a gate drive circuit, a plurality of clock signal lines, and a plurality of connecting lines that is disposed on the base substrate; wherein the plurality of clock signal lines is located on a side of the gate drive circuit along a first direction and is arranged in sequence; each connecting line is electrically connected with the gate drive circuit and a clock signal line;

at least one of the plurality of connecting lines comprises a load adjusting portion, wherein the load adjusting portion is configured to compensate for a load difference between different clock signal lines;

the plurality of clock signal lines comprises two groups of clock signal lines, a first group of clock signal lines comprises at least two clock signal lines, and a second group of clock signal lines comprises at least two clock signal lines; and load adjusting portions corresponding to the first group of clock signal lines are located between the first group of clock signal lines and the second group of clock signal lines.

2. The display panel according to claim 1, wherein load adjusting portions corresponding to the second group of clock signal lines form substantially a straight line along a second direction.

3. The display panel according to claim 2, wherein each of the plurality of connecting lines comprises a load adjusting portion, and load adjusting portions of the plurality of connecting lines are located on a side of the plurality of clock signal lines away from the gate drive circuit, or located on a side of the plurality of clock signal lines close to the gate drive circuit, or located between the first group of clock signal lines and the second group of clock signal lines.

4. The display panel according to claim 1, wherein there is no load adjusting portion configured between the at least two clock signal lines of the first group of clock signal lines, and there is no load adjusting portion configured between the at least two clock signal lines of the second group of clock signal lines.

5. The display panel according to claim 1, wherein an orthographic projection of the load adjusting portion of the at least one connecting line on the base substrate is not overlapped with an orthographic projection of a clock signal line connected with the load adjusting portion on the base substrate.

6. The display panel according to claim 5, wherein the at least one connecting line further comprises a first connecting portion and a second connecting portion, the load adjusting portion is connected between the first connecting portion and the second connecting portion, the first connecting portion is electrically connected with a clock signal line, and the second connecting portion is electrically connected with the gate drive circuit; and the plurality of clock signal lines extends along a second direction, the second direction intersects with the first direction; and the second connecting portion of the at least one connecting line extends along the first direction.

7. The display panel according to claim 5, wherein the gate drive circuit comprises a plurality of cascaded gate drive sub-circuits; each gate drive sub-circuit at least comprises a first output transistor; the first output transistor is configured to provide a clock signal to a signal output terminal of the gate drive sub-circuit; and a size of a first output transistor of a gate drive sub-circuit electrically connected with a clock signal line away from the gate drive circuit is greater than a size of a first output transistor of a gate drive sub-circuit electrically connected with a clock signal line close to the gate drive circuit.

8. The display panel according to claim 1, wherein the at least one connecting line further comprises a first connecting portion and a second connecting portion, the load adjusting portion is connected between the first connecting portion and the second connecting portion, the first connecting portion is electrically connected with a clock signal line, and the second connecting portion is electrically connected with the gate drive circuit; and the plurality of clock signal lines extends along a second direction, the second direction intersects with the first direction; and the second connecting portion of the at least one connecting line extends along the first direction.

9. The display panel according to claim 8, wherein the first connecting portion comprises a first connecting block and a first connecting strip which are connected with each other, the first connecting block is electrically connected with a corresponding clock signal line; and the first connection strip is electrically connected with a corresponding load adjusting portion.

10. The display panel according to claim 8, wherein the load adjusting portion of the at least one connecting line comprises a first sub-connecting portion, a second sub-connecting portion, and a third sub-connecting portion, the first sub-connecting portion and the third sub-connecting portion extend along the second direction, the second sub-connecting portion extends along the first direction, and two ends of the second sub-connecting portion are respectively connected with the first sub-connecting portion and the third sub-connecting portion.

11. The display panel according to claim 10, wherein the load adjusting portion of the at least one connecting line further comprises a fourth sub-connecting portion extending along the first direction, two ends of the fourth sub-connecting portion are respectively connected with the first sub-connecting portion and the third sub-connecting portion; and lengths of the second sub-connecting portion and the fourth sub-connecting portion along the first direction are approximately the same.

12. The display panel according to claim 11, wherein a distance between a second sub-connecting portion and a fourth sub-connecting portion of a load adjusting portion of a connecting line electrically connected with a clock signal line close to the gate drive circuit along the second direction is smaller than a distance between a second sub-connecting portion and a fourth sub-connecting portion of a load adjusting portion of a connecting line electrically connected with a clock signal line away from the gate drive circuit along the second direction.

13. The display panel according to claim 11, wherein a distance between a second sub-connecting portion and a fourth sub-connecting portion of a load adjusting portion of a connecting line electrically connected with a clock signal line close to the gate drive circuit along the second direction is greater than a distance between a second sub-connecting portion and a fourth sub-connecting portion of a load adjusting portion of a connecting line electrically connected with a clock signal line away from the gate drive circuit along the second direction.

14. The display panel according to claim 10, wherein lengths of first sub-connecting portions of the load adjusting portions of the plurality of connecting lines along the second direction are substantially the same, and lengths of third sub-connecting portions of the load adjusting portions of the plurality of connecting lines along the second direction are substantially the same.

15. The display panel according to claim 8, wherein lengths of first connecting portions of the plurality of connecting lines along the second direction are substantially the same, and a length of a second connecting portion of a connecting line electrically connected with a clock signal line close to the gate drive circuit along the first direction is smaller than a length of a second connecting portion of a connecting line electrically connected with a clock signal line away from the gate drive circuit along the first direction.

16. The display panel according to claim 8, wherein lengths of second connecting portions of the plurality of connecting lines along the first direction are substantially the same, and a length of a first connecting portion of a connecting line electrically connected with a clock signal line close to the gate drive circuit along the first direction is greater than a length of a first connecting portion of a connecting line electrically connected with a clock signal line away from the gate drive circuit along the first direction.

17. The display panel according to claim 1, wherein the gate drive circuit comprises a plurality of cascaded gate drive sub-circuits; each gate drive sub-circuit at least comprises a first output transistor; the first output transistor is configured to provide a clock signal to a signal output terminal of the gate drive sub-circuit; and a size of a first output transistor of a gate drive sub-circuit electrically connected with a clock signal line away from the gate drive circuit is greater than a size of a first output transistor of a gate drive sub-circuit electrically connected with a clock signal line close to the gate drive circuit.

18. The display panel according to claim 1, wherein a voltage amplitude of a clock signal transmitted by a clock signal line close to the gate drive circuit is smaller than a voltage amplitude of a clock signal transmitted by a clock signal line away from the gate drive circuit.

19. The display panel according to claim 1, wherein resistances of the plurality of connecting lines are substantially the same.

20. A display apparatus, comprising a display panel according to claim 1.

* * * * *